(12) United States Patent
Wang et al.

(10) Patent No.: US 12,225,791 B2
(45) Date of Patent: Feb. 11, 2025

(54) DISPLAY MODULE AND VEHICLE DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Jiaxiang Wang, Beijing (CN); Binfeng Feng, Beijing (CN); Fei Li, Beijing (CN); Qi Huang, Beijing (CN); Shangnan Jin, Beijing (CN); Yumin Li, Beijing (CN); Zhihong Cui, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 18/022,119

(22) PCT Filed: Mar. 29, 2022

(86) PCT No.: PCT/CN2022/083762
§ 371 (c)(1),
(2) Date: Feb. 17, 2023

(87) PCT Pub. No.: WO2023/184162
PCT Pub. Date: Oct. 5, 2023

(65) Prior Publication Data
US 2024/0251612 A1 Jul. 25, 2024

(51) Int. Cl.
*H05K 5/00* (2006.01)
*H05K 5/03* (2006.01)
(Continued)

(52) U.S. Cl.
CPC ......... *H10K 59/131* (2023.02); *H05K 5/0018* (2022.08); *H05K 5/03* (2013.01);
(Continued)

(58) Field of Classification Search
CPC .......................... H05K 5/0018; H10K 59/179
See application file for complete search history.

(56) References Cited

U.S. PATENT DOCUMENTS

2015/0043176 A1 2/2015 Ahn
2021/0263370 A1 8/2021 Maeng et al.
(Continued)

FOREIGN PATENT DOCUMENTS

| CN | 105931572 A | 9/2016 |
| CN | 113376882 A | 9/2021 |
| CN | 113597094 A | 11/2021 |

*Primary Examiner* — Sherman Ng
(74) *Attorney, Agent, or Firm* — IPro, PLLC

(57) ABSTRACT

Provided in the present disclosure are a display module and a vehicle display apparatus. The display module includes: a display panel, at least one flexible circuit board and at least one printed circuit board. The display panel includes a plurality of connection pads located in a bonding area. The flexible circuit board includes a first body, a plurality of output pads and a plurality of input pads, the first body includes a bendable portion and a flat portion which are connected, the bendable portion includes a protruding portion protruding relative to the flat portion. The printed circuit board includes a second body and a plurality of bonding pads, the second body includes a strip-shaped main body portion and at least one branching portion connected with a long side of the strip-shaped main body portion.

20 Claims, 24 Drawing Sheets

(51) Int. Cl.
*H10K 59/131* (2023.01)
*H10K 59/179* (2023.01)
*H10K 59/90* (2023.01)
*H10K 102/00* (2023.01)

(52) U.S. Cl.
CPC ........... *H10K 59/179* (2023.02); *H10K 59/90* (2023.02); *H10K 2102/311* (2023.02)

(56) References Cited

U.S. PATENT DOCUMENTS

2022/0087026 A1\* 3/2022 Park ..................... H05K 3/323
2023/0104777 A1\* 4/2023 Park ..................... H05K 1/0268
361/749

\* cited by examiner

DISPLAY MODULE AND VEHICLE DISPLAY APPARATUS

CROSS REFERENCE TO RELATED APPLICATIONS

The present disclosure is a US National Stage of International Application No. PCT/CN2022/083762, filed on Mar. 29, 2022, the entire contents of which are incorporated herein by reference.

FIELD

The present disclosure relates to the technical field of display, in particular to a display module and a vehicle display apparatus.

BACKGROUND

With the improvement of people's demands for a vehicle display experience, forms of vehicle display are more and more diversified. Traditional vehicle display based on a liquid crystal display (LCD) cannot meet a demand for diversified forms because the traditional vehicle display is generally in a rigid form of a plane or maximum curvature R≥1000 mm.

At present, vehicle display for achieving a plurality of forms of small-radius bending, an S shape and the like based on a flexible organic light-emitting diode (OLED) becomes a dominant trend at present.

SUMMARY

An embodiment of the present disclosure provides a display module, including: a display panel, at least one flexible circuit board and at least one printed circuit board; wherein the display panel includes a plurality of connection pads located in a bonding area; the flexible circuit board includes a first body, a plurality of output pads and a plurality of input pads, the first body includes a bendable portion and a flat portion which are connected with each other, the bendable portion includes a protruding portion protruding relative to the flat portion, the plurality of output pads are located on the protruding portion, and are in bonding connection with the plurality of connection pads, and the plurality of input pads are located on one side of the flat portion away from the bendable portion; and the printed circuit board includes a second body and a plurality of bonding pads, the second body includes a strip-shaped main body portion and at least one branching portion connected with a long side of the strip-shaped main body portion, the plurality of bonding pads are located on at least one side edge of each branching portion adjacent to the strip-shaped main body portion, and the plurality of bonding pads are in bonding connection with the plurality of input pads.

In one possible implementation, the output pads extend in a first direction, and are sequentially arranged in a second direction intersecting with the first direction, the input pads extend in a third direction and are sequentially arranged in a fourth direction intersecting with the third direction, the first direction is roughly the same as the fourth direction, and the second direction is roughly the same as the third direction.

In one possible implementation, the flat portion includes a first side edge adjacent to the protruding portion, a second side edge opposite to the first side edge and a third side edge away from the bendable portion, the first side edge and the second side edge both extend in the second direction, the first side edge is longer than the second side edge, and the third side edge inclines by a preset angle relative to the first direction.

In one possible implementation, the fourth direction is roughly the same as an extending direction of the third side edge.

In one possible implementation, the flexible circuit board further includes a driver chip located on the flat portion, and the driver chip is located on one side of the plurality of input pads close to the bendable portion.

In one possible implementation, the driver chip roughly extends in the first direction.

In one possible implementation, the extending direction of the driver chip is roughly the same as the extending direction of the third side edge of the flat portion away from the bendable portion.

In one possible implementation, the flexible circuit board further includes a plurality of signal wires, each signal wire is electrically connected with the driver chip and the corresponding output pad respectively, and lengths of the signal wires are roughly the same.

In one possible implementation, the signal wire electrically connected with the output pad close to the driver chip in the plurality of output pads is in curve design, and the signal wire electrically connected with the output pad away from the driver chip in the plurality of output pads is in straight-line design.

In one possible implementation, a shape of an orthographic projection of the signal wire electrically connected with the output pad close to the driver chip in the plurality of output pads on the flexible circuit board includes at least one of a single triangle, a triangular sawtooth, a single rectangle, a rectangular sawtooth or an arc.

In one possible implementation, the plurality of bonding pads extend in the third direction and are sequentially arranged in the fourth direction intersected with the third direction.

In one possible implementation, only one side edge of two branching portions located at edges in at least one branching portion adjacent to a short side of the strip-shaped main body portion is provided with the plurality of bonding pads, and two side edges of other branching portions adjacent to the strip-shaped main body portion are both provided with the plurality of bonding pads.

In one possible implementation, two side edges of all the branching portions adjacent to the strip-shaped main body portion are both provided with the plurality of bonding pads.

In one possible implementation, the short side of the strip-shaped main body portion protrudes out of the branching portion on an outmost side.

In one possible implementation, the short side of the strip-shaped main body portion is flush with a corresponding side edge of the branching portion on the outmost side.

An embodiment of the present disclosure further provides a vehicle display apparatus, including: an above display module, and a thin film encapsulation layer, a touch function layer, a filter layer and a protection cover plate which are located on the display module.

DETAILED DESCRIPTION OF THE EMBODIMENTS

To make the objectives, technical solutions and advantages of embodiments of the present disclosure clearer, the technical solutions of the embodiments of the present disclosure will be clearly and completely described below in conjunction with the accompanying drawings of the embodiments of the present disclosure. Obviously, the described embodiments are a part of the embodiments of the present disclosure, not all of them. In addition, the embodiments in the present disclosure and features in the embodiments may be combined with each other without conflict. Based on the described embodiments of the present disclosure, all other embodiments obtained by those ordinarily skilled in the art without the need for creative labor fall within the scope of a protection of the present disclosure.

Unless otherwise defined, technical or scientific terms used in the present disclosure shall have the ordinary meanings understood by those ordinarily skilled in the art to which the present disclosure pertains. "Comprise" or "include" or other similar words used in the present disclosure indicate that an element or item appearing before such words covers listed elements or items appearing after the words and equivalents thereof, and do not exclude other elements or items.

It should be noted that the size and shape of figures in the accompanying drawings do not reflect the true proportions, and are only aimed to illustrate the content of the present disclosure. Throughout same or similar labels indicate the same or similar elements or elements having the same or similar functions.

Figure 1:
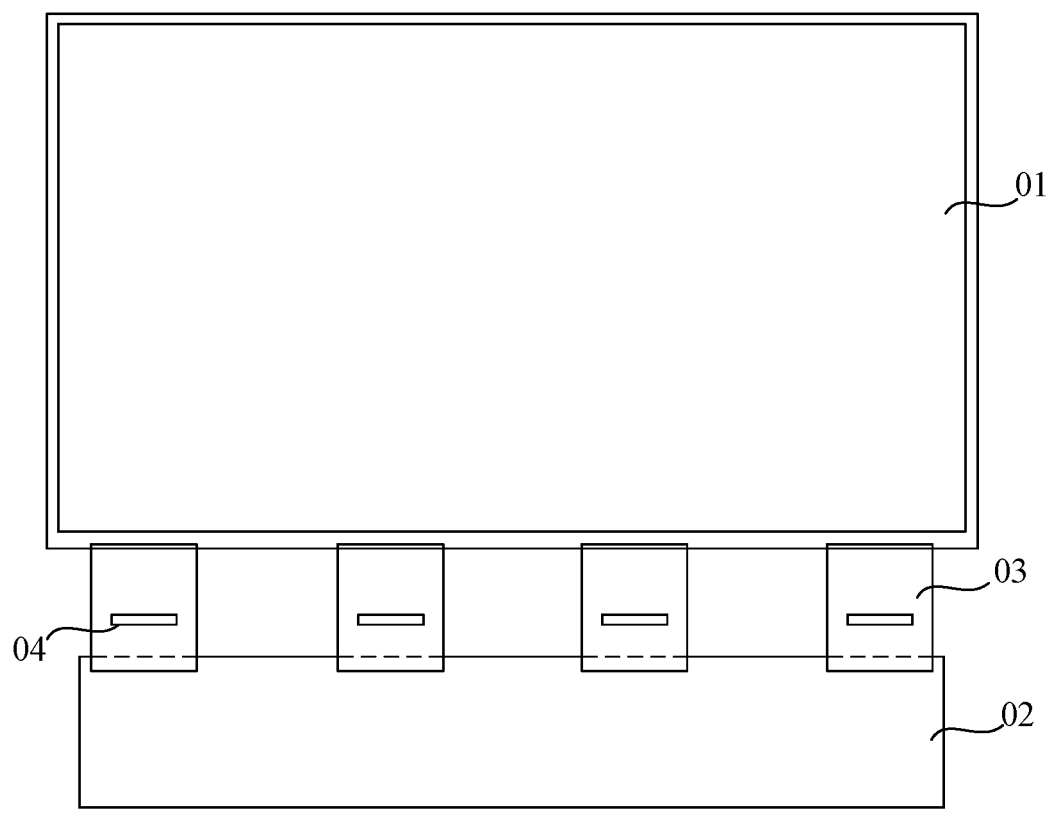
FIG. 1 is one of structural schematic diagrams of a COF bonding scheme in the related art.
Figure 2:
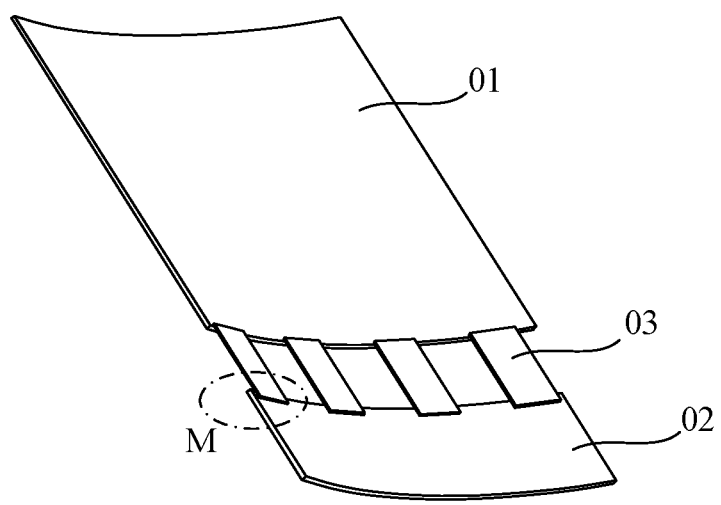
FIG. 2 is one of structural schematic diagrams of peeling of a bonding position of a PCB and a COF in a COF bonding scheme in the related art.
Figure 3:
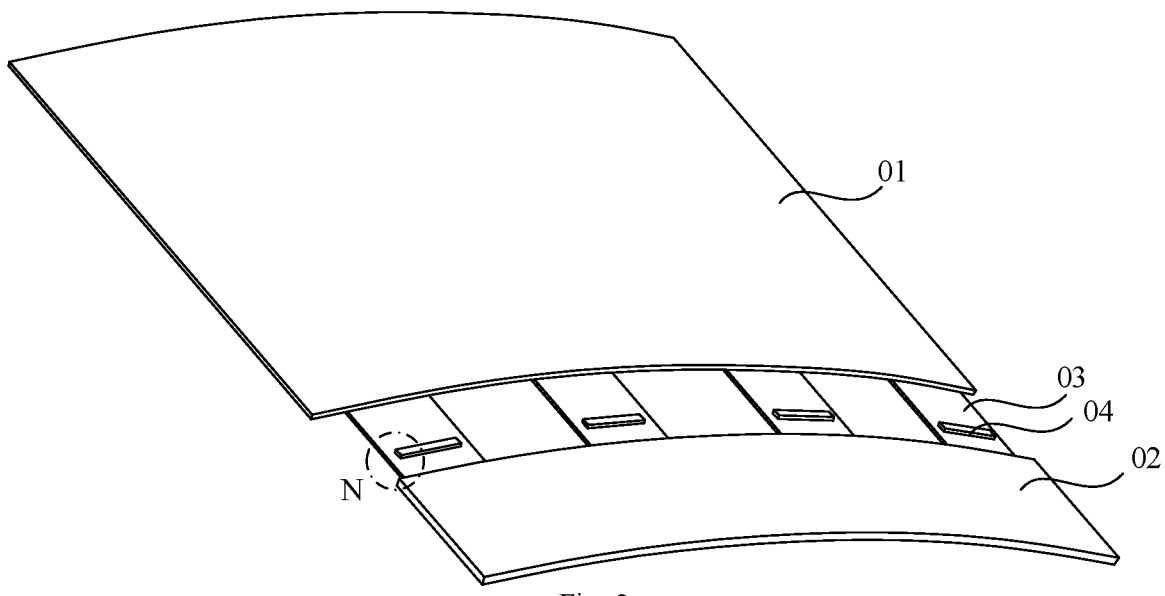
FIG. 3 is one of structural schematic diagrams of IC crack in a COF bonding scheme in the related art.

In the related art, vehicle display based on a flexible OLED may achieve a plurality of forms of small-radius bending, an S shape and the lik. FIG. 1 shows one of structural schematic diagrams of bonding a chip on film (COF) 03 with a panel 01 and a printed circuit board (PCB) 02 respectively. FIG. 2 and FIG. 3 show that the panel 01 becomes a C shape after being fitted on a cover glass (CG), the CG is not shown in the figures, FIG. 2 is one of front structural schematic diagrams corresponding to a COF Bonding scheme shown in FIG. 1, and FIG. 3 is one of reverse structural schematic diagrams corresponding to the COF bonding scheme shown in FIG. 1. A peeling position of a bonding position of the PCB 02 and the COF 03 is shown in a dotted box M in the FIG. 2, and a crack position of an integrated circuit 04 on the COF 03 is shown in a dotted box N in FIG. 3. Due to reasons like the quantity of channels, when the rectangular COF 03 is bent along with the panel 01, IC crack and poor PCB bonding are caused since the IC 04 on the COF 03 and the PCB 02 bonding on the COF 03 are straight rigid components and cannot be bent along with the COF 03.

In view of this, embodiments of the present disclosure provide a display module and a vehicle display apparatus, configured to avoid IC crack and PCB peeling, and improve use performance of a flexible circuit board and a printed circuit board.

Figure 4:
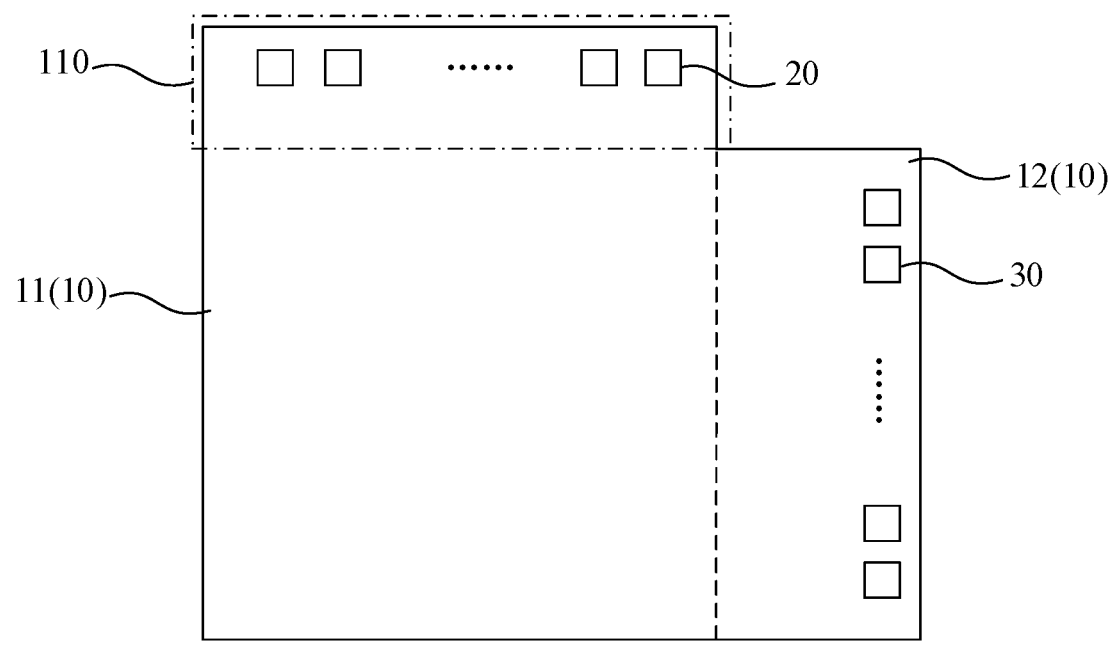
FIG. 4 is one of structural schematic diagrams of a flexible circuit board provided by an embodiment of the present disclosure.

The FIG. 4 shows one of structural schematic diagrams of a flexible circuit board in an embodiment of the present disclosure, and specifically, the flexible circuit board provided by the embodiment of the present disclosure includes: a first body 10, a plurality of output pads 20 and a plurality of input pads 30.

The first body 10 includes a bendable portion 11 and a flat portion 12 which are connected with each other, and the bendable portion 11 includes a protruding portion 110 protruding relative to the flat portion 12.

The plurality of output pads 20 are located on the protruding portion 110, and are in bonding connection with a display panel.

The plurality of input pads 30 are located on one side of the flat portion 12 away from the bendable portion 11 and are in bonding connection with a printed circuit board.

Further as shown in combination with FIG. 4, the first body 10 includes the bendable portion 11 and the flat portion 12 which are connected with each other, and the bendable portion 11 includes the protruding portion 110 protruding relative to the flat portion 12. The bendable portion 11 may be bent to forms such as a C shape and an S shape, and in the bending process, the flat portion 12 may be kept straight. In the specific implementation, the bendable portion 11 and the flat portion 12 may form an L-shaped first body 10, and correspondingly, the flexible circuit board is designed in an L shape.

Further as shown in combination with FIG. 4, the flexible circuit board further includes the plurality of output pads 20, located on the protruding portion 110, and configured for being in bonding connection with the display panel. In other words, the flexible circuit board may be in bonding connection with the display panel through the plurality of output pads 20, therefore, the flexible circuit board may output a control signal related to a display function to the display panel through the plurality of output pads 20, so that use performance of the flexible circuit board is ensured. In addition, the specific quantity of the plurality of output pads 20 may be set according to actual application requirements, which is not limited herein.

The flexible circuit board further includes the plurality of input pads 30, located on one side of the flat portion 12 away from the bendable portion 11. The plurality of input pads 30 are in bonding connection with the printed circuit board. In other words, the flexible circuit board may be in bonding connection with the printed circuit board through the plurality of input pads 30, therefore, the printed circuit board may output a related signal to the flexible circuit board through the plurality of input pads 30, so that use performance of the flexible circuit board is ensured. In addition, the specific quantity of the plurality of input pads 30 may be set according to actual application requirements, which is not limited herein.

In the first body 10 of the flexible circuit board provided by the embodiment of the present disclosure, not only does the bendable portion 11 of the first body 10 include the protruding portion 110 protruding relative to the flat portion 12, but also the flat portion 12 of the first body 10 is kept straight in the bending process of the bendable portion 11. Compared with a flexible circuit board in the related art, after the flexible circuit board is in bonding connection with the display panel and the printed circuit board subsequently, in the process of bending the display panel, not only can avoid the crack caused by bending of the flexible circuit board, but also poor bonding caused by pulling of the bonding position of the flexible circuit board and the printed circuit board may be avoided, and therefore the use performance of the flexible circuit board is improved.

In the embodiment of the present disclosure, the respective output pads 20 extend in a first direction, and are sequentially arranged in a second direction intersecting with the first direction; the respective input pads 30 extend in a third direction and are sequentially arranged in a fourth direction intersecting with the third direction; the first direction is roughly the same as the fourth direction, and the second direction is roughly the same as the third direction.

Figure 5:
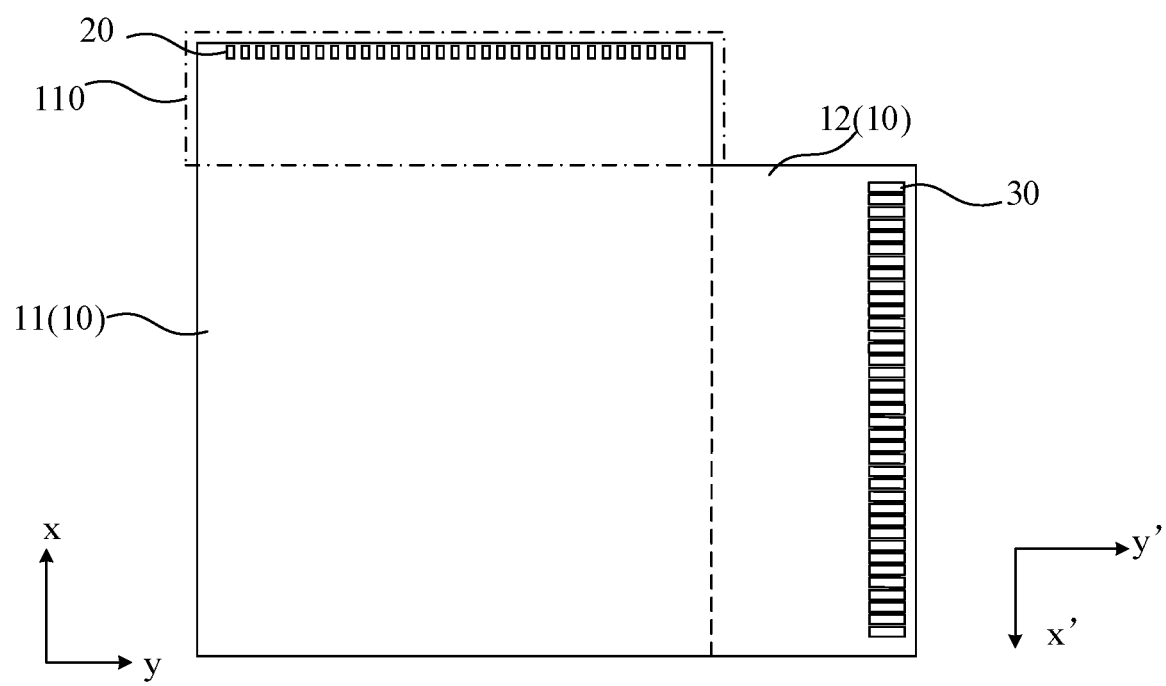
FIG. 5 is one of structural schematic diagrams of a flexible circuit board provided by an embodiment of the present disclosure.

In one of exemplary embodiments, as shown in FIG. 5, to ensure functions of signal input and signal output of the flexible circuit board and improve bonding performance of the flexible circuit board with the display panel and the printed circuit board respectively, the respective output pads 20 in the plurality of output pads 20 extend in the first direction, and are sequentially arranged in the second direction intersecting with the first direction; the respective input pads 30 in the plurality of input pads 30 extend in the third direction and are sequentially arranged in the fourth direction intersecting with the third direction, the first direction is roughly the same as the fourth direction, and the second direction is roughly the same as the third direction. A direction shown by an arrow x is the first direction, a direction shown by an arrow y is the second direction, a direction shown by an arrow y' is the third direction, and a direction shown by an arrow x' is the fourth direction. It should be illustrated that in the embodiments of the present disclosure, "roughly the same" may be completely the same and also may be approximately the same. FIG. 5 shows a situation that the first direction is completely the same as the fourth direction, and the second direction is completely the same as the third direction.

In the embodiment of the present disclosure, setting of the flat portion 12 in the flexible circuit board may have a plurality of situations below, but is not limited to the plurality of situations below. In one exemplary embodiment, as shown in FIG. 6, the flat portion 12 includes a first side edge 121 adjacent to the protruding portion 110, a second side edge 122 opposite to the first side edge 121 and a third side edge 123 away from the bendable portion 11, the first side edge 121 and the second side edge 122 both extend in the second direction, the first side edge 121 is longer than the second side edge 122, and the third side edge 123 inclines by a preset angle relative to the first direction.

Figure 6:
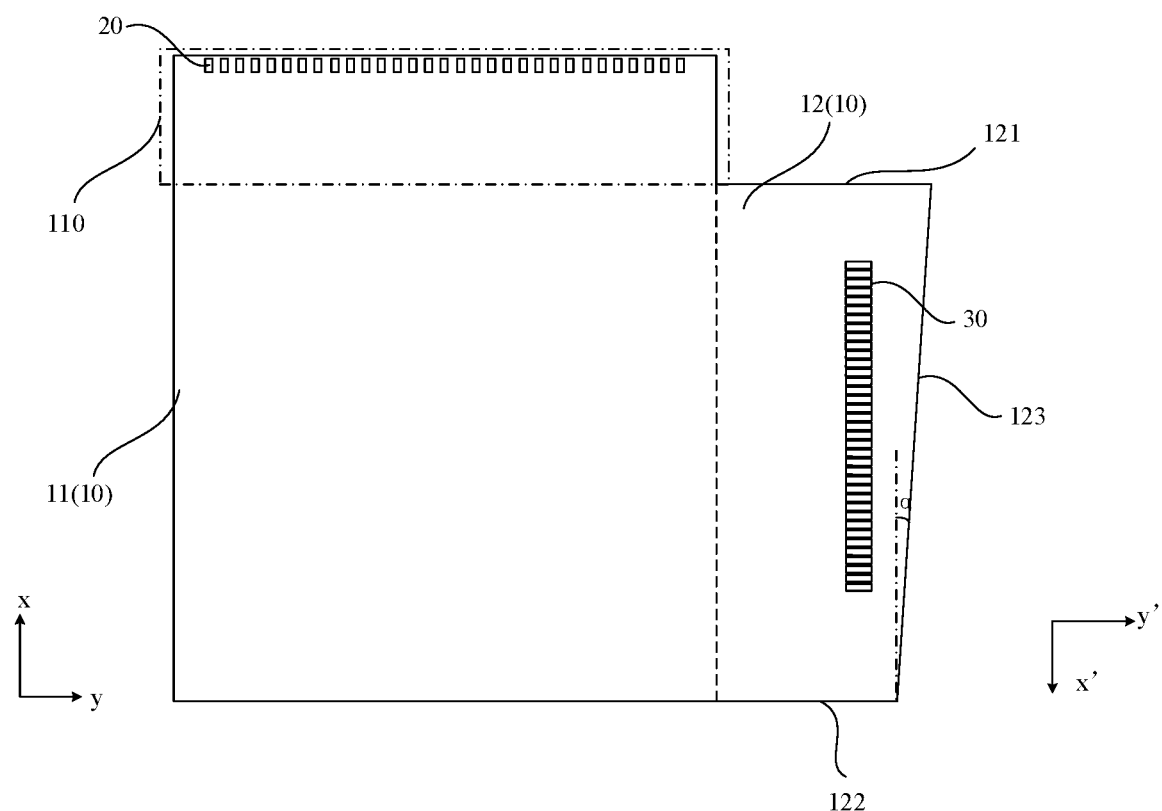
FIG. 6 is one of structural schematic diagrams of a flexible circuit board provided by an embodiment of the present disclosure.

Further as shown in combination with FIG. 6, the flat portion 12 includes the first side edge 121 adjacent to the protruding portion 110, the second side edge 122 opposite to the first side edge 121 and the third side edge 123 away from the bendable portion 11. The first side edge 121 and the second side edge 122 both extend in the second direction, the first side edge 121 is longer than the second side edge 122, the third side edge 123 inclines by the preset angle relative to the first direction, and as shown in FIG. 6, the preset angle is a. Certainly, those skilled in the art may preset a specific numerical value of the preset angle of the third side edge 123 inclining relative to the first direction according to the actual application requirements, which is not limited herein.

Figure 7:
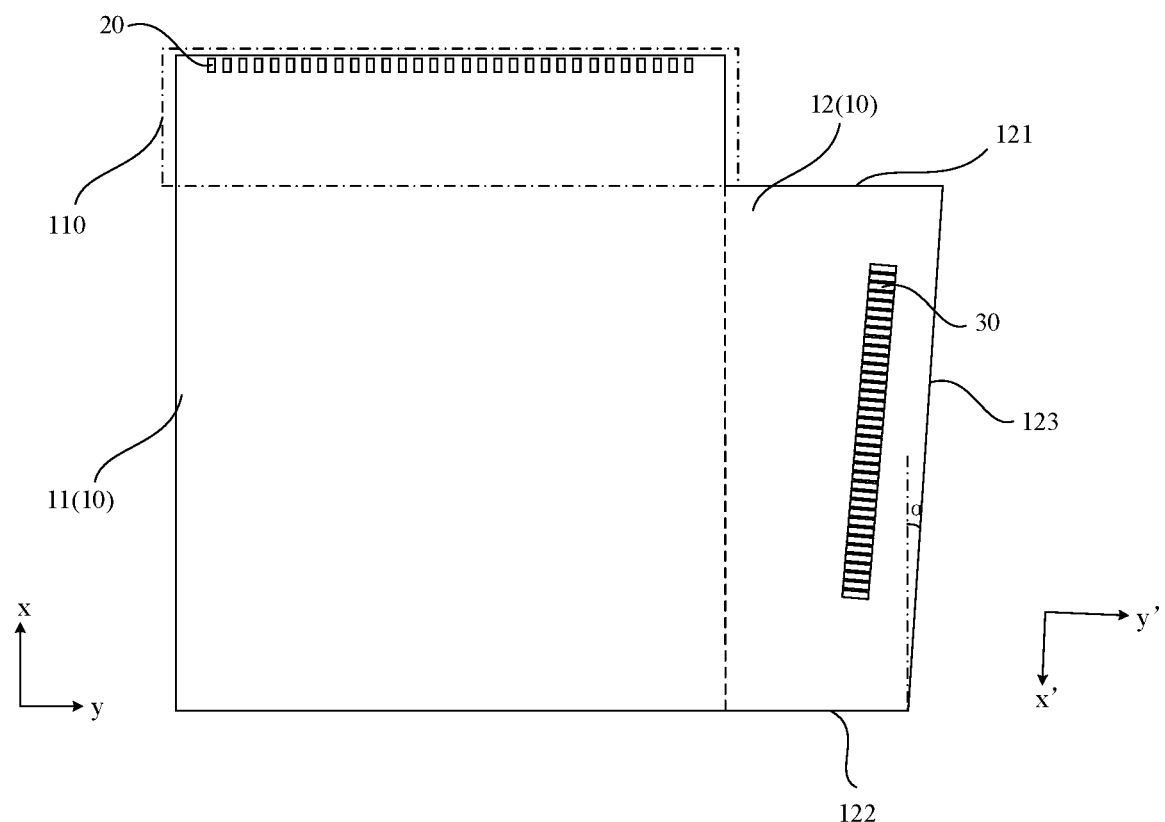
FIG. 7 is one of structural schematic diagrams of a flexible circuit board provided by an embodiment of the present disclosure.

In one of exemplary embodiments, as shown in FIG. 7, the fourth direction is roughly the same as the extending direction of the third side edge 123.

Figure 8:
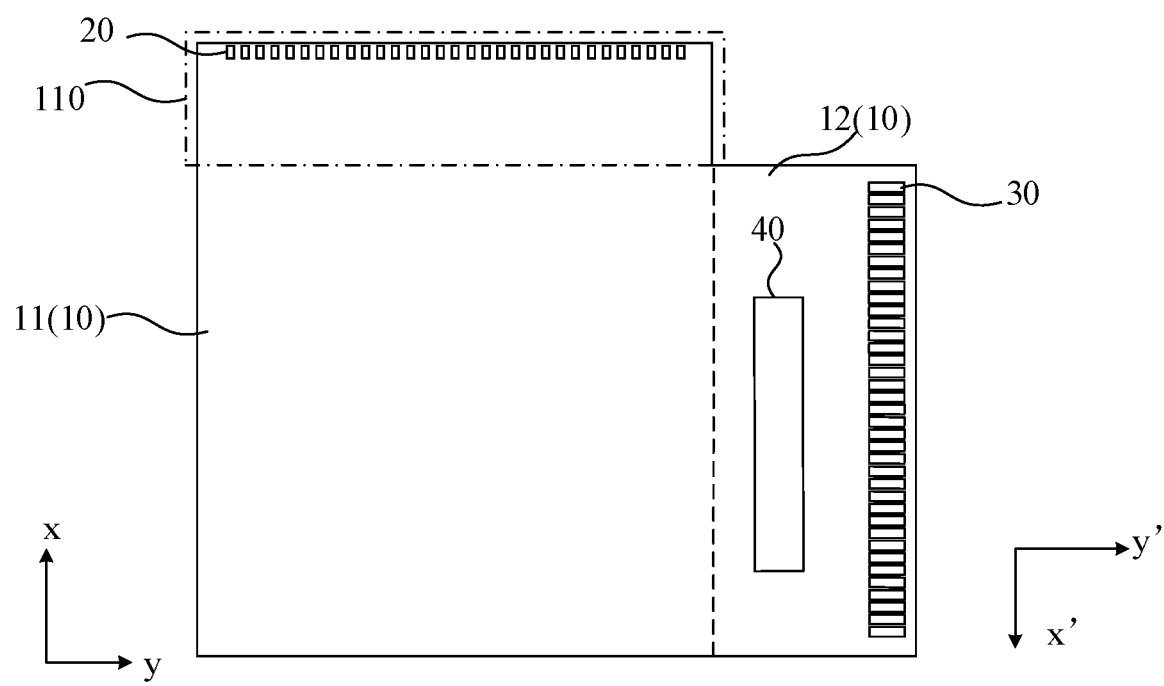
FIG. 8 is one of structural schematic diagrams of a flexible circuit board provided by an embodiment of the present disclosure.
Figure 9:
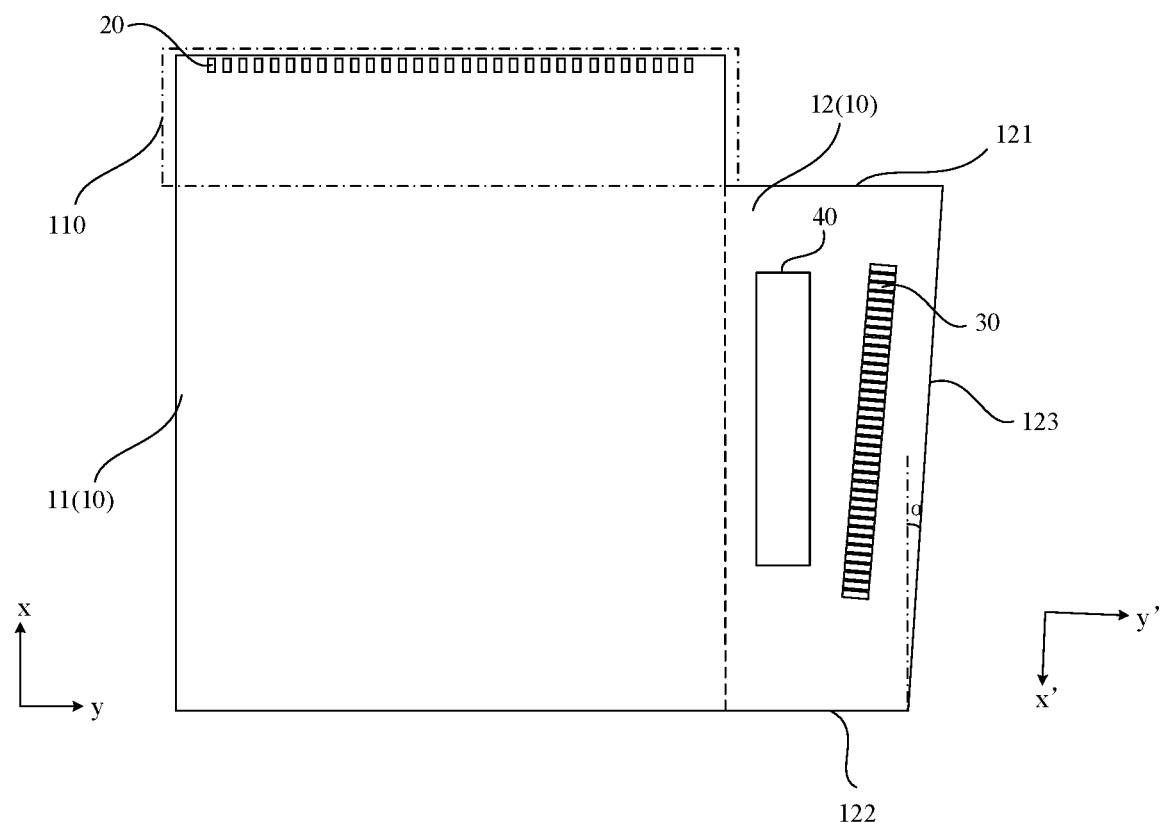
FIG. 9 is one of structural schematic diagrams of a flexible circuit board provided by an embodiment of the present disclosure.
Figure 10:
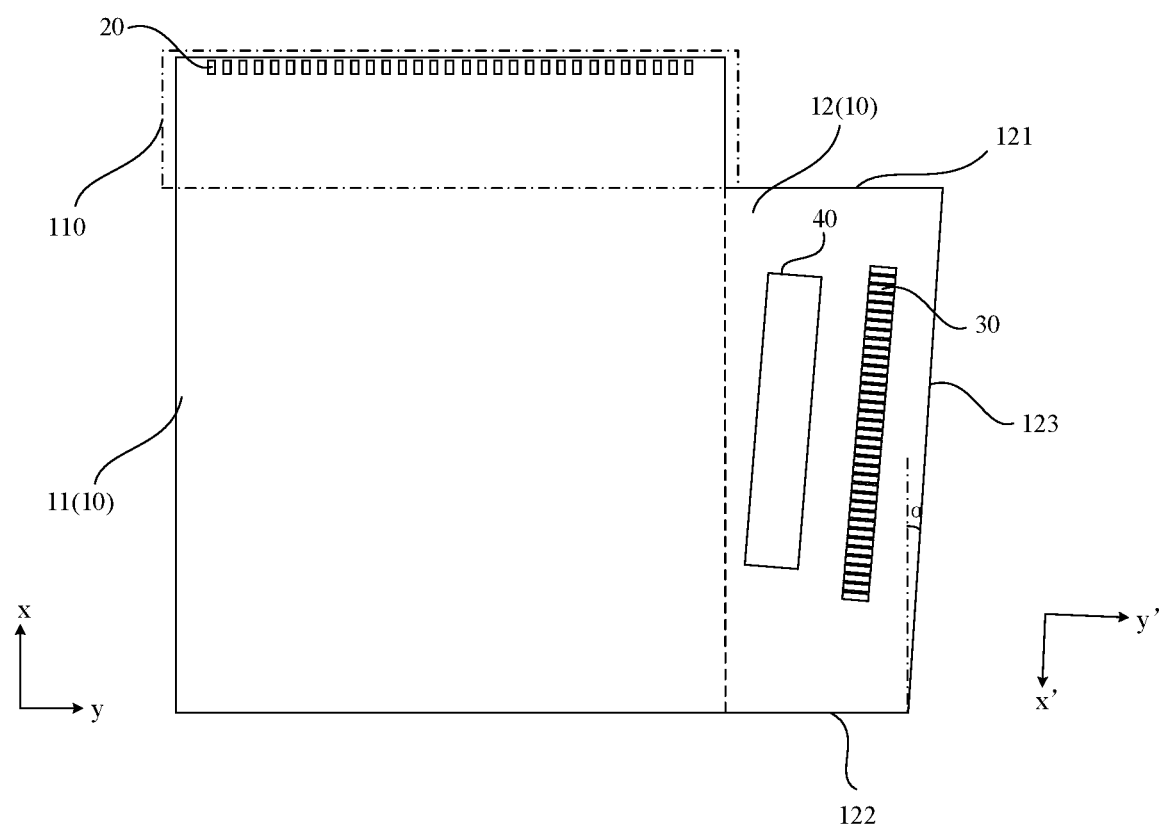
FIG. 10 is one of structural schematic diagrams of a flexible circuit board provided by an embodiment of the present disclosure.

In the embodiment of the present disclosure, the flexible circuit board may be the COF, as shown in FIG. 8 to FIG. 10, the flexible circuit board further includes a driver chip 40 located on the flat portion 12, and the driver chip 40 is located on one side of the plurality of input pads 30 close to the bendable portion 11.

Further as shown in combination with FIG. 8 to FIG. 10, the flexible circuit board further includes the driver chip 40 located on the flat portion 12, and the driver chip 40 is configured to load a control signal related to a display function to the display panel in bonding with the plurality of output pads 20 through the plurality of output pads 20, such as a clock signal, a frame start signal, a high potential signal and a low potential signal. In addition, the driver chip 40 is located on one side of the plurality of input pads 30 close to the bendable portion 11, and space distributions between the plurality of input pads 30 and the driver chip 40 are in noninterference.

As shown in combination with FIG. 8 and FIG. 9, in one of exemplary embodiments, the driver chip 40 roughly extends in the first direction, so as to improve a space utilization rate of the flat portion 12.

As shown in combination with FIG. 10, in one of exemplary embodiments, the extending direction of the driver chip 40 is roughly the same as the extending direction of the third side edge 123 of the flat portion 12 away from the bendable portion 11. Thus, the problem of uneven wire resistances of the flexible circuit board is solved, and the use performance of the flexible circuit board is improved. Certainly, in addition to setting the driver chip 40 through the above mode, other modes may be adopted based on the conception of the present disclosure for setting, which is not limited herein.

In the embodiment of the present disclosure, the flexible circuit board further includes a plurality of signal wires 50, each signal wire 50 is electrically connected with the driver chip 40 and the corresponding output pad 20 respectively, and lengths of the respective signal wires 50 are roughly the same.

In the specific implementation, the flexible circuit board further includes the plurality of signal wires 50, and the specific quantity of the plurality of signal wires 50 may be set according to the actual application requirements, which is not limited herein. Each signal wire 50 in the plurality of signal wires 50 is electrically connected with the driver chip 40 and a corresponding output pad 20 in the plurality of output pads 20 respectively, and lengths of the respective signal wires 50 are roughly the same, therefore, the lengths of the respective signal wires 50 are adjusted to be roughly the same by adjusting the lengths of the signal wires 50 to ensure that resistances of the respective signal wires 50 are roughly the same, and after the flexible circuit board is in bonding connection with the display panel through the plurality of output pads 20, display uniformity of the display panel is ensured, and a display effect of the display panel is improved. In addition, the flexible circuit board further includes a plurality of wires electrically connected with the driver chip 40 and the plurality of input pads 30, the respective wires are arranged in a straight-line mode, the respective wires are directly connected with the corresponding input pads 30, and the plurality of wires may be distributed in a sector mode, so that it is ensured that related signals may be loaded to the driver chip 40 through the respective input pads 30, and the use performance of the flexible circuit board is ensured.

Figure 11:
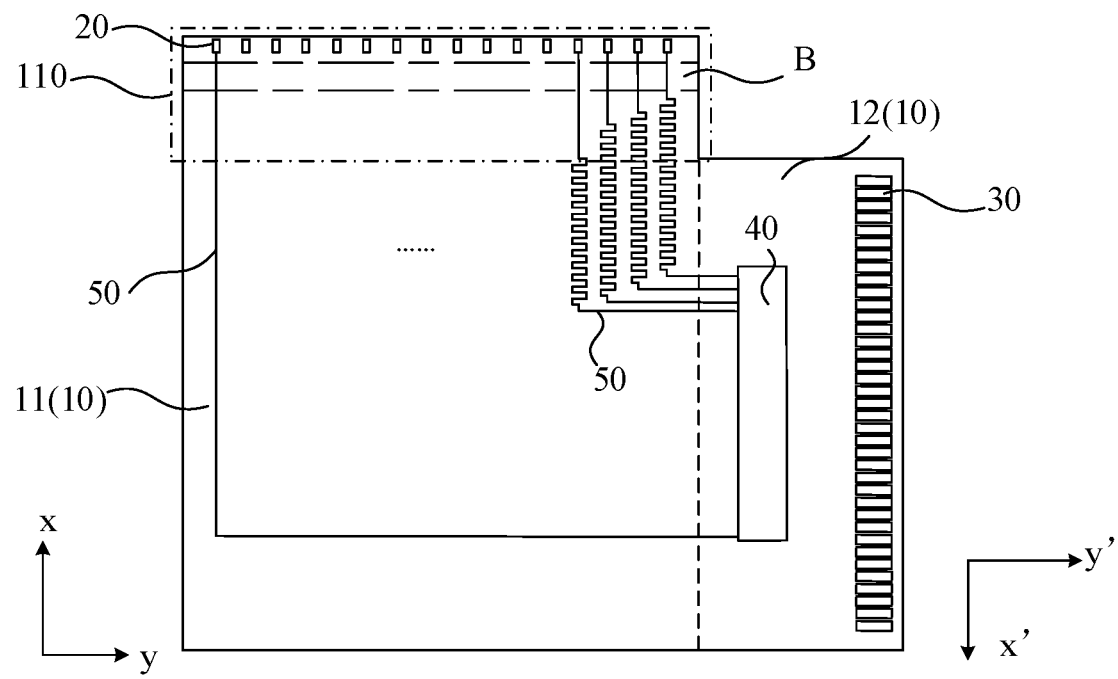
FIG. 11 is one of structural schematic diagrams of a flexible circuit board provided by an embodiment of the present disclosure.

In one of exemplary embodiments, as shown in combination with FIG. 11, the signal wire 50 electrically connected with the output pad 20 in the plurality of output pads 20 close to the driver chip 40 is in curve design, and the signal wire 50 electrically connected with the output pad 20 in the plurality of output pads 20 away from the driver chip 40 is in straight-line design.

In the embodiment of the present disclosure, a shape of an orthographic projection of the signal wire 50 electrically connected with the output pad 20 in the plurality of output pads 20 close to the driver chip 40 on the flexible circuit board includes at least one of a single triangle, a triangular sawtooth, a single rectangle, a rectangular sawtooth or an arc.

Further as shown in combination with FIG. 11, a projection shape of a signal wire 50 electrically connected with an output pad 20 in the plurality of output pads 20 close to the driver chip 40 on the flexible circuit board is one of structural schematic diagrams of the rectangular sawtooth, setting situations of all the signal wires 50 are not illustrated in FIG. 11, and the same disclosed conception may be adopted to set each signal wire 50, which is not repeated. The signal wire 50 electrically connected with the output pad 20 in the plurality of output pads 20 away from the driver chip 40 is in straight-line design, so as to set the lengths of all the signal wires 50 to be roughly the same, and therefore uniformity of resistances of all the signal wires 50 is ensured, and use performance of the flexible circuit board is improved.

In one of exemplary embodiments, as shown in FIG. 11, the signal wire 50 electrically connected with the output pad 20 in the plurality of output pads 20 away from the driver chip 40 is in straight-line design, the projection shape of the signal wire 50 electrically connected with the output pad 20 in the plurality of output pads 20 close to the driver chip 40 on the flexible circuit board is the rectangular sawtooth, and includes a plurality of rectangular repetitive units with the same size, if all the rectangular repetitive units are distributed on the corresponding signal wires 50 in an equidensity mode, the quantity of rectangular repetitive units on the plurality of signal wires 50 is in decreasing trend along the first direction and away from the direction of the driver chip 40, and all the signal wires 50 in FIG. 11 may adopt the same conception to be arranged, which is not repeated. Therefore, uniformity of the resistances of all the signal wires 50 is ensured, and therefore use performance of the flexible circuit board is improved.

Figure 12:
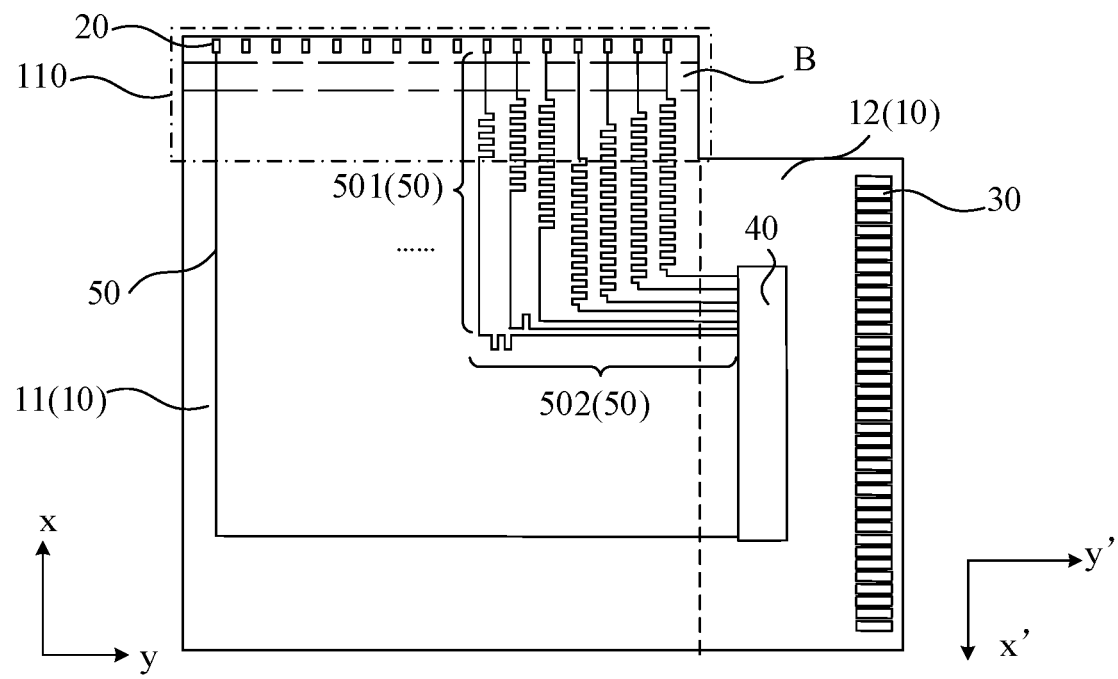
FIG. 12 is one of structural schematic diagrams of a flexible circuit board provided by an embodiment of the present disclosure.

In one of exemplary embodiments, as shown in FIG. 12, in the plurality of signal wires 50 electrically connected with the plurality of output pads 20 and the driver chip 40, each signal wire 50 includes a first portion 501 extending in a first direction and a second portion 502 extending in a second direction. In a specific implementation, the signal wire 50 in curve design includes at least one curve unit, the at least one curve unit may be only arranged on the first portion 501, or may be only arranged on the second portion 502 or may be respectively arranged on the first portion 501 and the second portion 502. Certainly, all the signal wires 50 may be arranged according to bending performance of the flexible circuit board, which is not limited herein.

It should be illustrated that FIG. 11 and FIG. 12 only illustrate setting situations of part of signal wires 50, and certainly, the signal wire 50 between each output pad 20 and the driver chip 40 may be set according to the above similar design conception, which is not repeated.

In the flexible circuit board provided by the embodiment of the present disclosure, the flexible circuit board further includes a bendable area B, the bendable area B is located on one side of the plurality of output pads 20 close to the bendable portion 11, and after the plurality of output pads 20 are in bonding connection with the display panel, part of one side of the bendable area B in the flexible circuit board away from the plurality of output pads 20 is bent to a back face of the display panel along the bendable area B, so as to ensure narrow-frame design of the display panel. In addition, further as shown in combination with FIG. 11, parts of all the signal wires 50 in the bendable area B are in straight-line design, so as to avoid crack of the signal wires 50, and the use performance of the display panel is improved. Certainly, besides the above mentioned structure, the flexible circuit board in the embodiment of the present disclosure may further set other structures according to the actual application needs, and other structures may be set with reference to the related art, which is not repeated.

Figure 13:
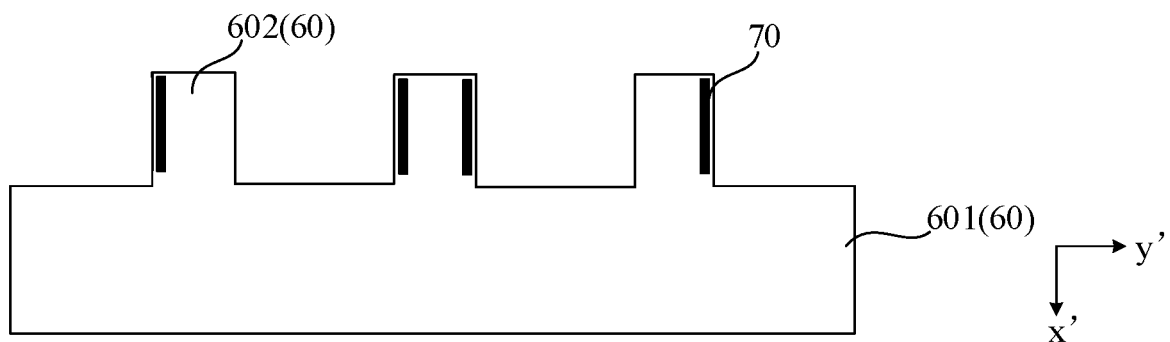
FIG. 13 is one of structural schematic diagrams of a printed circuit board provided by an embodiment of the present disclosure.

Based on the same disclosed conception, as shown in FIG. 13, an embodiment of the present disclosure further provides a printed circuit board, including a second body 60 and a plurality of bonding pads 70.

The second body 60 includes a strip-shaped main body portion 601 and at least one branching portion 602 connected with a long side of the strip-shaped main body portion 601, and the quantity of the at least one branching portion 602 may be one or more, which is not limited herein.

The plurality of bonding pads 70 are located on at least one side edge of each branching portion 602 adjacent to the strip-shaped main body portion 601, and the plurality of bonding pads 70 extend in a third direction, are sequentially arranged in a fourth direction intersecting with the third direction, and are in bonding connection with the plurality of input pads 30 of the flexible circuit board described in any of above.

Further as shown in combination with FIG. 13, the printed circuit board provided by the embodiment of the present disclosure includes a second body 60. The second body 60 includes a strip-shaped main body portion 601 and at least one branching portion 602 connected with a long side of the strip-shaped main body portion 601. The specific quantity of the at least one branching portion 602 may be set according to the actual application requirements, which is not limited herein. The printed circuit board further includes a plurality of bonding pads 70 located on at least one side edge of each branching portion 602 adjacent to the strip-shaped main body portion 601, and the quantity of side edges of the branching portion 602 adjacent to the strip-shaped main body portion 601 is two. In the specific implementation, a plurality of bonding pads may be arranged on one side edge of the branching portion 602 adjacent to the strip-shaped main body portion 601, or, a plurality of bonding pads may be arranged on two side edges of the branching portion 602 adjacent to the strip-shaped main body portion 601, and the bonding pads may be set according to the actual application, which is not limited herein. The plurality of bonding pads 70 extend in the third direction and are sequentially arranged in the fourth direction intersecting with the third direction. A direction shown by an arrow y' represents the third direction, and a direction shown by an arrow x' represents the fourth direction. In the specific implementation, the plurality of bonding pads 70 are configured to bond the plurality of input pads 30 of the above flexible circuit board.

In the embodiment of the present disclosure, the printed circuit board may be arranged in a plurality of modes below, but is not limited to the arrangement modes below. In one of exemplary embodiments, further as shown in combination with FIG. 13, only one side edge of two branching portions 602 located at edges in at least one branching portion 602 adjacent to the short side of the strip-shaped main body portion 601 is provided with the plurality of bonding pads 70, and two side edges of other branching portions 602 adjacent to the strip-shaped main body portion 601 are both provided with the plurality of bonding pads 70.

Further as shown in combination with FIG. 13, only one side edge of two branching portions 602 located at the edges in at least one branching portion 602 adjacent to the short side of the strip-shaped main body portion 601 is provided with the plurality of bonding pads 70, and two side edges of other branching portions 602 in the at least one branching portion 602 adjacent to the strip-shaped main body portion 601 are both provided with the plurality of bonding pads 70.

In the specific implementation, all the branching portions 602 are arranged symmetrically relative to a center line of the strip-shaped main body portion 601, and correspondingly, the plurality of bonding pads 70 are symmetrically arranged relative to a center line of the strip-shaped main body portion, so as to ensure structural stability of the printed circuit board.

Figure 14:
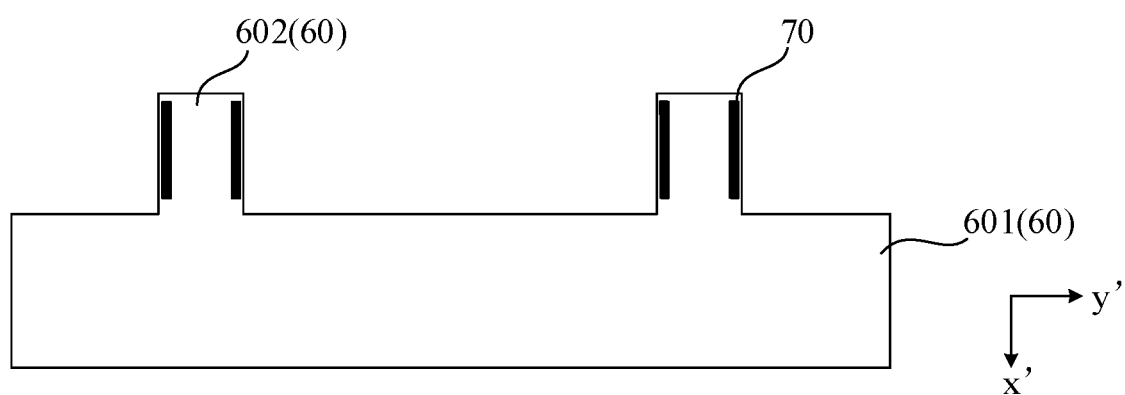
FIG. 14 is one of structural schematic diagrams of a printed circuit board provided by an embodiment of the present disclosure.
Figure 15:
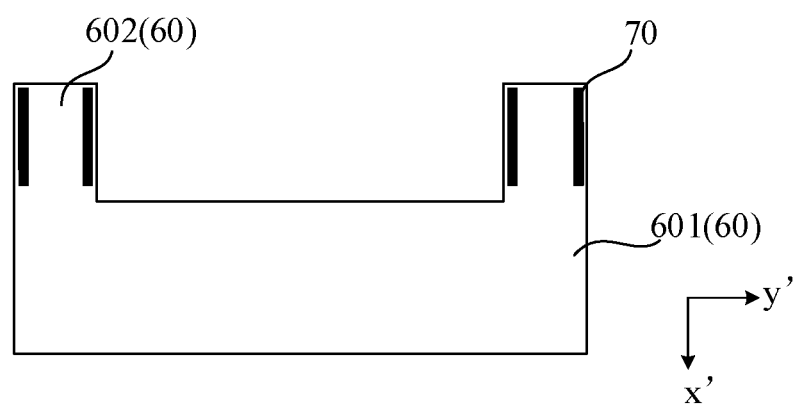
FIG. 15 is one of structural schematic diagrams of a printed circuit board provided by an embodiment of the present disclosure.

In the embodiment of the present disclosure, as shown in FIG. 14 and FIG. 15, two side edges of the respective branching portions 602 adjacent to the strip-shaped main body portion 601 are both provided with the plurality of bonding pads 70. When the printed circuit board is in bonding connection with the flexible circuit board through the plurality of bonding pads 70 subsequently, uniformity of stress of all the branching portions 602 of the printed circuit board is ensured, and use performance of the printed circuit board is improved.

In one of exemplary embodiments, as shown in FIG. 14, the short side of the strip-shaped main body portion 601 protrudes out of the branching portion 602 on the outmost side.

In one of exemplary embodiments, as shown in FIG. 15, the short side of the strip-shaped main body portion 601 is flush with the corresponding side edge of the branching portion 602 on the outmost side. Relative to setting of FIG. 14, the long side of the printed circuit board may be made shorter, so as to ensure thinning design of the printed circuit board.

Figure 16:
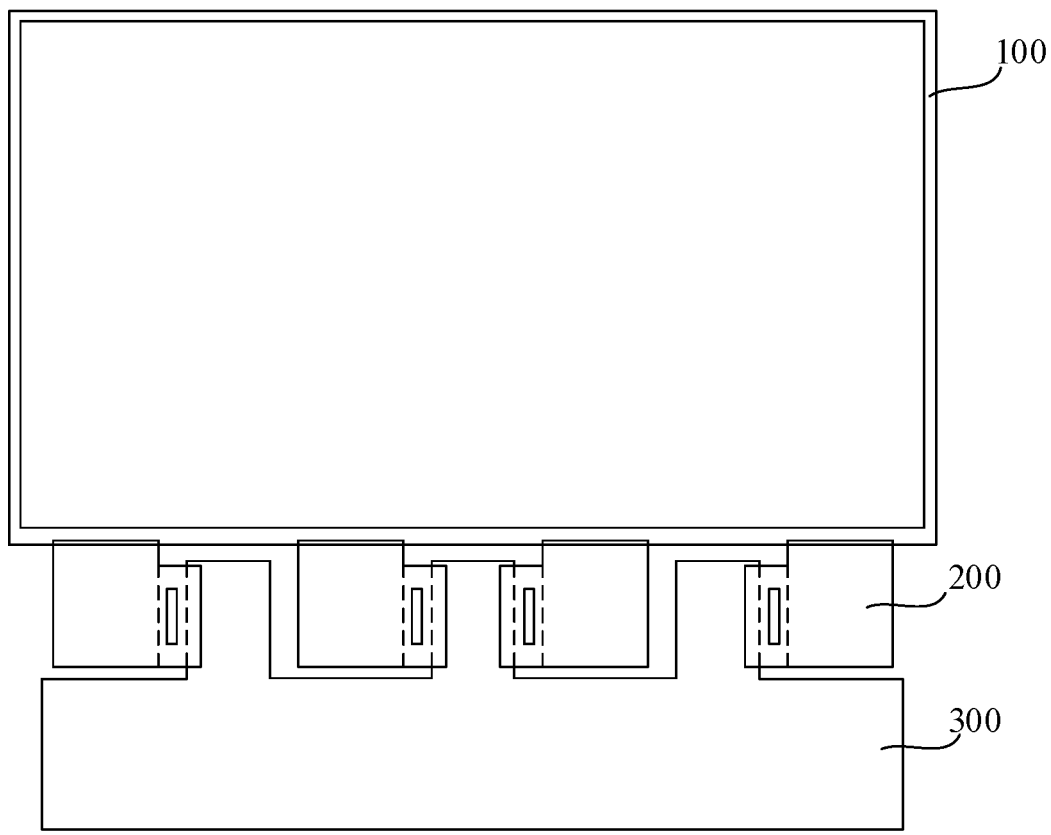
FIG. 16 is one of structural schematic diagrams of a display module provided by an embodiment of the present disclosure.

Based on the same disclosed conception, as shown in FIG. 16, an embodiment of the present disclosure further provides a display module, including: a display panel 100, at least one flexible circuit board 200 and at least one printed circuit board 300.

The display panel 100 includes a plurality of connection pads (not illustrated in FIG. 16) located in a bonding area. The quantity of at least one flexible circuit board 200 may be one or more, which is not limited herein. The quantity of at least one printed circuit board 300 may be one or more, which is not limited herein. FIG. 16 illustrates a situation that the display module includes four flexible circuit boards 200 and one printed circuit board 300. Certainly, the quantity of at least one flexible circuit board 200 and the quantity of at least one printed circuit board 300 in the display module may be set according to the actual application requirements, which is not limited herein.

The flexible circuit board 200 includes a first body 10, a plurality of output pads 20 and a plurality of input pads 30. The first body 10 includes a bendable portion 11 and a flat portion 12 which are connected with each other. The bendable portion 11 includes a protruding portion 110 protruding relative to the flat portion 12. The plurality of output pads 20 are located on the protruding portion 110, and are in bonding connection with the plurality of connection pads. The plurality of input pads 30 are located on one side of the flat portion 12 away from the bendable portion 11.

The printed circuit board 300 includes a second body 60 and a plurality of bonding pads 70. The second body 60 includes a strip-shaped main body portion 601 and at least one branching portion 602 connected with a long side of the strip-shaped main body portion 601. The plurality of bonding pads 70 are located on at least one side edge of each branching portion 602 adjacent to the strip-shaped main body portion 601, and the plurality of bonding pads 70 are in bonding connection with the plurality of input pads 30.

Taking the display module including the four flexible circuit boards 200 and one printed circuit board 300 as an example. Further as shown in combination with FIG. 16, the flexible circuit boards 200 may adopt a structure as shown in FIG. 8. The printed circuit board 300 may adopt a structure as shown in FIG. 13. Correspondingly, the flexible circuit boards 200 and the printed circuit board 300 are electrically connected through the plurality of input pads 30 and the plurality of bonding pads 70, and therefore, the printed circuit board 300 may output a related signal to the flexible circuit boards through the plurality of bonding pads 70 and the plurality of input pads 30. Moreover, the flexible circuit boards 200 and the display panel 100 are electrically connected through the plurality of output pads 20 and the plurality of connection pads, and therefore the flexible circuit boards 200 may output a control signal related to a display function to the display panel through the plurality of output pads 20 and the plurality of connection pads, and use performance of the display apparatus is ensured.

It should be illustrated that the display module provided by the embodiment of the present disclosure is not only limited to a situation of including the four flexible circuit boards 200, and may further include flexible circuit boards 200 of the other quantity, and the quantity of the flexible circuit boards 200 may be set according to the actual application requirements, which is not limited herein.

In the display module provided by the embodiment of the present disclosure, the flexible circuit boards 200 adopt non-straight design (special-shaped design) shown in FIG. 16, in a process of bending the bendable portions 11 of the flexible circuit boards 200 subsequently, the flat portions 12 are kept straight, crack caused by bending of the flexible circuit boards 200 is avoided, and moreover, poor bonding caused by pulling of a bonding position of the flexible circuit boards 200 and the printed circuit board is further avoided, which ensures the use performance of the display apparatus.

As shown in combination with FIG. 16 and FIG. 5 to FIG. 12, all the output pads 20 extend in the first direction and are sequentially arranged in the second direction intersecting with the first direction, all the input pads 30 extend in the third direction and are sequentially arranged in the fourth direction intersecting with the third direction, the first direction is roughly the same as the fourth direction, and the second direction is roughly the same as the third direction.

Figure 17:
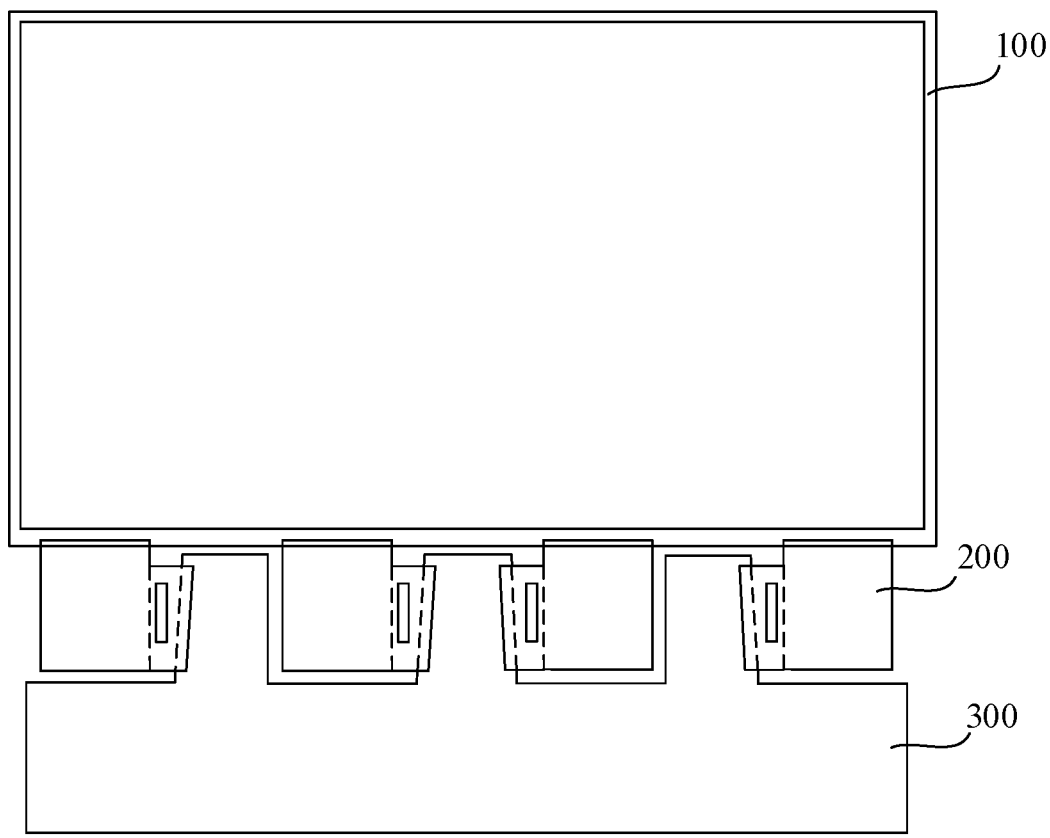
FIG. 17 is one of structural schematic diagrams of a display apparatus provided by an embodiment of the present disclosure.

In the embodiment of the present disclosure, FIG. 17 is one of structural schematic diagrams of a display module. In FIG. 17, a flexible circuit board 200 may adopt a structure shown in FIG. 9, and a printed circuit board 300 may adopt a structure similar to FIG. 13. In the flexible circuit board 200, a flat portion 12 includes a first side edge 121 adjacent to a protruding portion 110, a second side edge 122 opposite to the first side edge 121 and a third side edge 123 away from a bendable portion 11, the first side edge 121 and the second side edge 122 both extend in a second direction, the first side edge 121 is longer than the second side edge 122, the third side edge 123 inclines by a preset angle relative to the first direction, and the preset angle may be a shown in FIG. 9.

Figure 18:
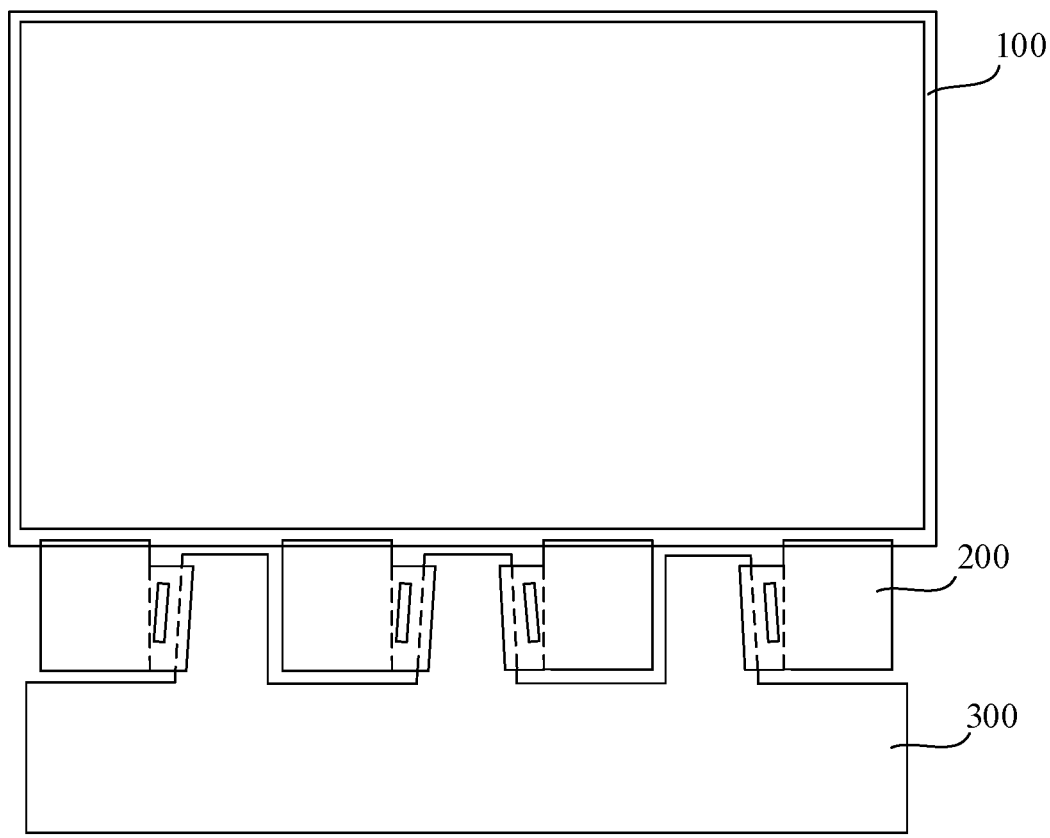
FIG. 18 is one of structural schematic diagrams of a display apparatus provided by an embodiment of the present disclosure.

In one of exemplary embodiments, FIG. 18 is one of structural schematic diagrams of a display module, in FIG. 18, a flexible circuit board 200 may adopt a structure shown in FIG. 10, a printed circuit board 300 may adopt a structure similar to FIG. 13, and a fourth direction is the same as an extending direction of a third side edge 123.

In the embodiment of the present disclosure, as shown in FIG. 16 to FIG. 18, the flexible circuit board 200 may further include a driver chip 40, located on the flat portion 12, and the driver chip 40 is located on one side of the plurality of input pads 30 close to the bendable portion 11, and the driver chip 40 may be set by referring to FIG. 8 to FIG. 10, which is not repeated.

In one of exemplary embodiments, further as shown in combination with FIG. 8 and FIG. 9, the driver chip 40 extends roughly in the first direction.

In one of exemplary embodiments, as shown in FIG. 10, the extending direction of the driver chip 40 is roughly the same as the extending direction of the flat portion 12 away from the third side edge 123 of the bendable portion 11.

In the embodiment of the present disclosure, the flexible circuit board 200 further includes the plurality of signal wires 50, each signal wire 50 is electrically connected with the driver chip 40 and the corresponding output pad 20, and the lengths of the signal wires 50 are roughly the same.

In the embodiment of the present disclosure, the signal wire 50 electrically connected with the output pad 20 in the plurality of output pads 20 close to the driver chip 40 is in curve design, and the signal wire 50 electrically connected with the output pad 20 in the plurality of output pads 20 away from the driver chip 40 is in straight-line design.

In the embodiment of the present disclosure, a shape of an orthographic projection of the signal wire 50 electrically connected with the output pad 20 in the plurality of output pads 20 close to the driver chip 40 on the flexible circuit board includes at least one of a single triangle, a triangular sawtooth, a single rectangle, a rectangular sawtooth or an arc. In one of exemplary embodiments, the signal wires 50 may be arranged by referring to FIG. 11 and FIG. 12, which is not repeated here. Certainly, the signal wires 50 may be arranged according to the actual application needs, which is not limited here.

In the embodiment of the present disclosure, the plurality of bonding pads 70 in the printed circuit board 300 extend in the third direction and are sequentially arranged in the fourth direction intersected with the third direction, and specific design may refer to FIG. 13, which is not repeated herein.

In the embodiment of the present disclosure, further as shown in combination with FIG. 16, the plurality of bonding pads 70 are located on one side edge of two branching portions 602 in at least one branching portion 602 adjacent to the short side of the strip-shaped main body portion 601, and the plurality of bonding pads 70 are arranged on two side edges of other branching portions 602 adjacent to the strip-shaped main body portion 601.

Figure 19:
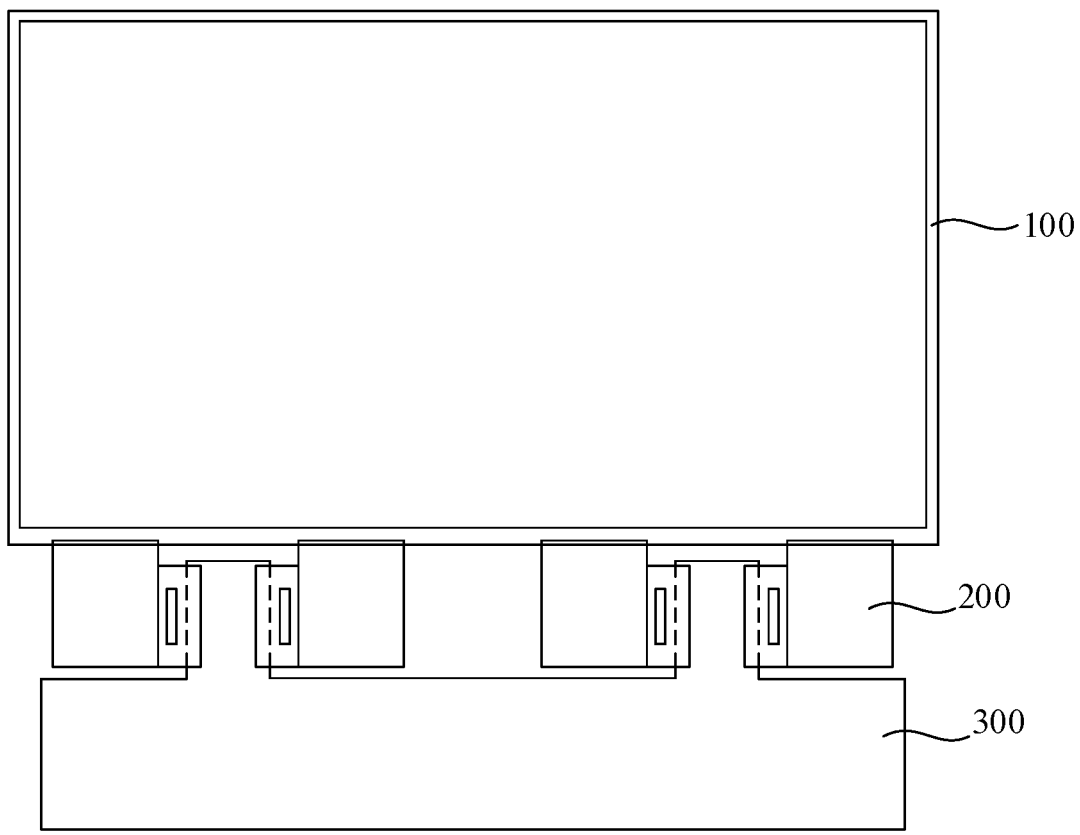
FIG. 19 is one of structural schematic diagrams of a display apparatus provided by an embodiment of the present disclosure.
Figure 20:
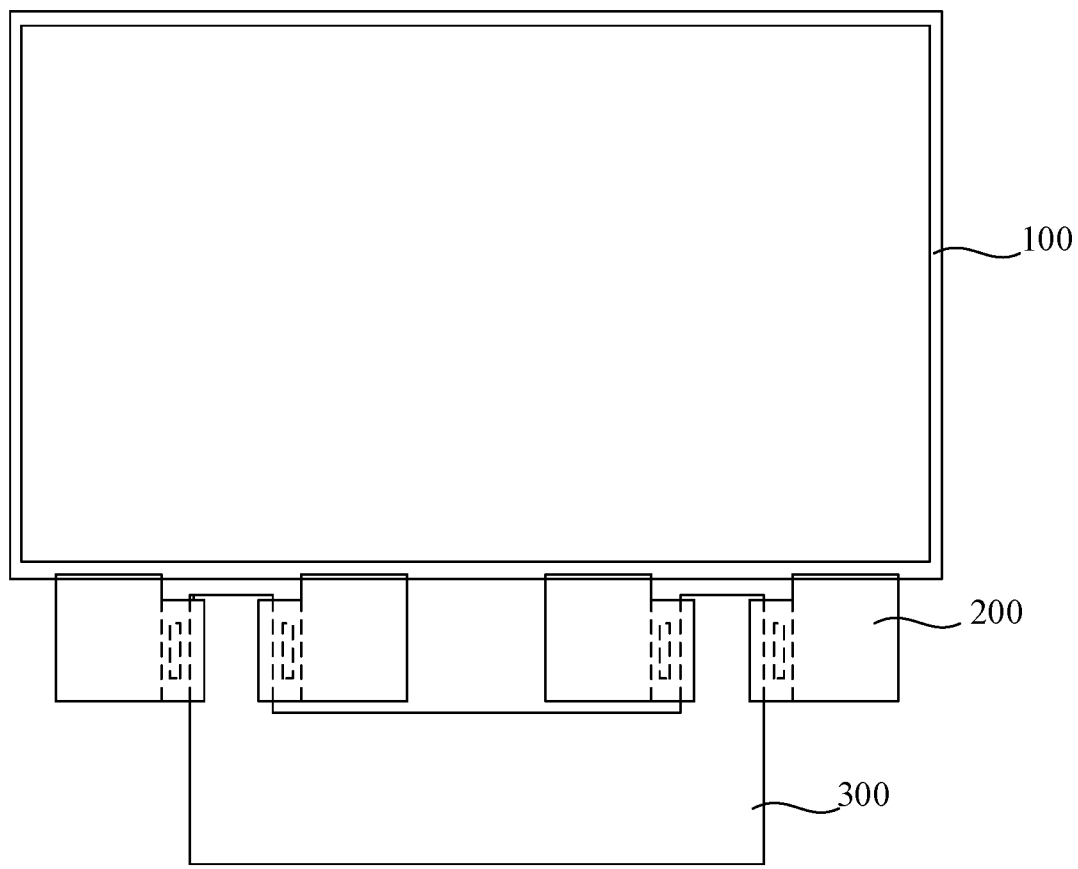
FIG. 20 is one of structural schematic diagrams of a display apparatus provided by an embodiment of the present disclosure.

In the embodiment of the present disclosure, as shown in FIG. 19 and FIG. 20, the plurality of bonding pads 70 are arranged on two side edges of all the branching portions 602 adjacent to the strip-shaped main body portion 601.

Further in combination with FIG. 19, the short side of the strip-shaped main body portion 601 protrudes out of the branching portion 602 on the outmost side.

Further in combination with FIG. 20, the short side of the strip-shaped main body portion 601 is flush with the corresponding side of the branching portion 602 on the outmost side.

In the specific implementation, a principle of solving problems by the display module is similar to the above flexible circuit board 200 and the printed circuit board 300, and therefore, the implementation of the display module may refer to implementations of the above flexible circuit board 200 and the printed circuit board 300, and repetition will not be repeated.

According to the structure of the above flexible circuit board 200 and the structure of the corresponding printed circuit board 300, in the display module, a plurality of modes may be adopted in matching of the special-shaped flexible circuit board 200 and the special-shaped printed circuit board 300, in the specific implementation, the flexible circuit board 200 and the printed circuit board 300 may be arranged according to the quantity of the flexible circuit boards 200 and design requirements thereof, the quantity of the flexible circuit boards 200 is related to a screen resolution ratio, for example, arrangement of the resolution ratio being 2560*1600 and a true RGB pixel is adopted, the quantity of flexible circuit boards 200 is n, a specific numerical value range is n=2560*3/1920=4, and the quantity of channels is 1920. Certainly, the quantity of flexible circuit boards 200 may be arranged according to the actual application needs, which is not limited here. In the specific implementation process, the display module may be arranged in a plurality of modes below, but is not limited to the plurality of modes below, and the display apparatus may be arranged according to the actual application needs, which is not limited here.

In one of exemplary embodiments, as shown in FIG. 16 to FIG. 18, only one side edge of two branching portions 602 located at edges in the printed circuit board 300 adjacent to a short side of the strip-shaped main body portion 601 is provided with the plurality of bonding pads 70, two side edges of other branching portions 602 in at least one branching portion 602 adjacent to the strip-shaped main body portion 601 are both provided with the plurality of bonding pads 70, and all the flexible circuit boards 200 are symmetrically distributed relative to a center line of the printed circuit board 300.

In one of exemplary embodiments, as shown in FIG. 19, two side edges of all the branching portions 602 in the printed circuit board 300 adjacent to the strip-shaped main body portion 601 are both provided with the plurality of bonding pads 70, the short side of the strip-shaped main body portion 601 protrudes out of the branching portion 602 on the outmost side, and all the flexible circuit boards 200 are symmetrically distributed relative to the center line of the printed circuit board 300.

In one of exemplary embodiments, as shown in FIG. 20, two side edges of all the branching portions 602 in the printed circuit board 300 adjacent to the strip-shaped main body portion 601 are both provided with the plurality of bonding pads 70, the short side of the strip-shaped main body portion 601 is flush with the corresponding side edge of the branching portion 602 on the outmost side, and all the flexible circuit boards 200 are symmetrically distributed relative to the center line of the printed circuit board 300.

It should be illustrated that in the specific implementation, in addition to being able to adopt the above mentioned related mode to arrange a position relation between the display panel 100 and the flexible circuit board 200 and the printed circuit board 300 in the display module, other modes may be adopted according to the inventive conception to arrange the display module, which is not repeated.

Figure 21:
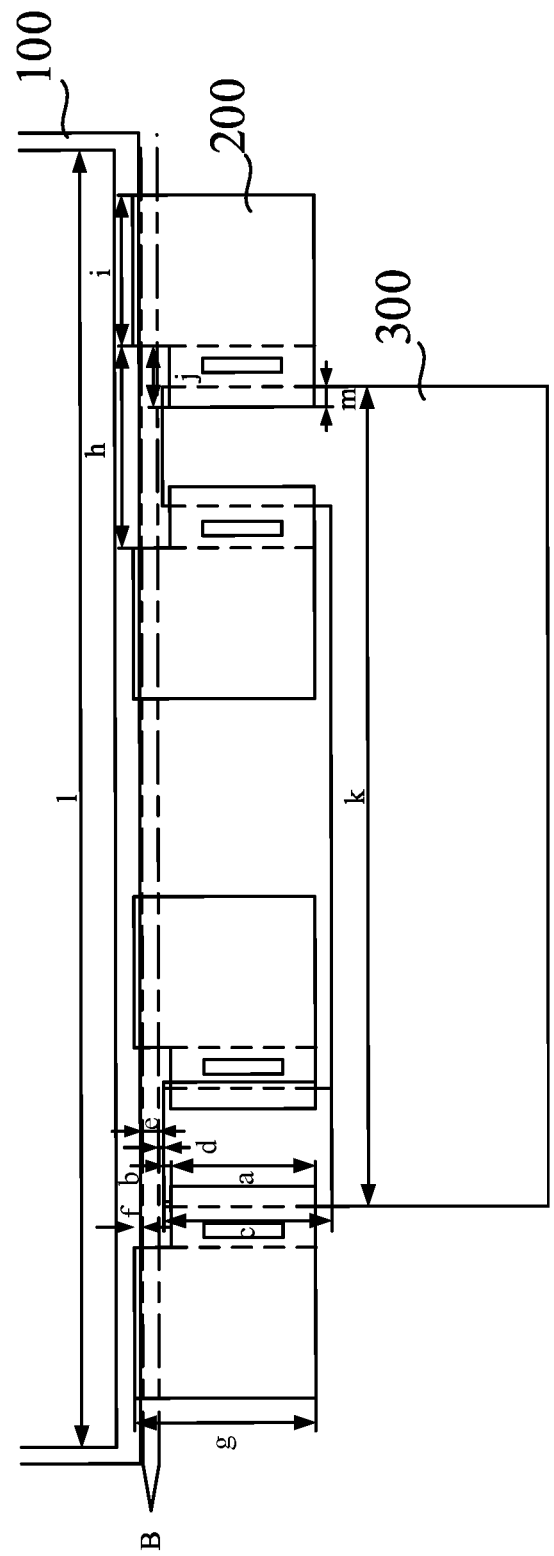
FIG. 21 is one of structural schematic diagrams of a display apparatus provided by an embodiment of the present disclosure.

In one of exemplary embodiments, as shown in combination with FIG. 21, related parameters of the flexible circuit board 200, the printed circuit board 300 and the display panel 100 in the display module may be set according to following rules. a represents an extending length of the third side edge 123 of the flat portion 12 along the fourth direction, and a specific numerical value range of the extending length is decided by the quantity of the input pads 30 and a pitch between two adjacent pads; b represents a length of the branching portion 602 in the fourth direction exceeding the flat portion 12, and a corresponding numerical value range may meet b≥3.5 mm; c represents an extending length of the branching portion 602 along the fourth direction, and a corresponding numerical value range may meet c≥(a+2b); d represents a distance between the branching portion 602 and the bendable area B, a corresponding numerical value range may meet d≥(0.06*(a bonding tolerance of the printed circuit board 300)+0.15*(a contour tolerance of the printed circuit board 300)+0.5*(a bending tolerance of the flexible circuit board 200)), and in one of exemplary embodiments, d may be 0.7 mm; e represents a width of the bendable area B, and a corresponding numerical value range is decided by a bending radius; f represents a bonding width of the plurality of output pads 20 along the second direction, and a corresponding numerical value range may meet (1.5*(a bonding width)+0.5*(a gluing width)=2*(adjustment according to a specific item)); g represents an extending width of the flexible circuit board 200 along the first direction, and a corresponding numerical value range may meet (g=a+b+d+e+f); l represents an extending width of an active area (AA) of the display panel 100 along the second direction, and a corresponding numerical value range may meet (l≥i*n+h*(n−1)+7.06*(a distance between the flexible circuit board 200 and the AA)); k represents an extending length of the strip-shaped main body portion 601 along the third direction, and a corresponding numerical value range may meet (k=l−7.06*2−i*2−j*2+m*2); in the embodiment of the present disclosure, the numerical value corresponding to k is far less than a minimum length (for example, the minimum length is (l−7.06*2+3.5*2)) of a PCB in a traditional scheme of FIG. 1, and correspondingly, in the embodiment of the present disclosure, the printed circuit board 300 with a smaller size may exist; h represents a distance between the bendable portions 11 in the two flexible circuit boards 200, and a corresponding numerical value range meets a set value≥17.024 mm; i represents an extending length of the plurality of output pads 20 along the second direction, and a corresponding numerical value range is decided by the quantity of the plurality of output pads 20 and the pitch between two adjacent output pads 20; j represents an extending length of the flat portion 12 along the second direction, and a corresponding numerical value range meets (j≥m+0.5*(a gluding width)+a length of the driver chip 40 along the first direction+a crimpinpadg needed width); and m represents an extending length of the plurality of input pads 30 of the flexible circuit board 200 along the third direction. Certainly, a related numerical value of a-m may be set according to the actual application requirements, which is not limited herein.

In the embodiment of the present disclosure, the flexible circuit boards 200 and the printed circuit board 300 will be heated during bonding to cause an anisotropic conductive film (ACF) to take effect. The flexible circuit boards 200 and the printed circuit board 300 will expand during heating, the flexible circuit boards 200 and the printed circuit board 300 are made of different materials, corresponding expansion coefficients are different, and expansion amounts are also different. Therefore, pre-shrinking of different numerical values generally needs to be performed on the flexible circuit boards 200 and the printed circuit board 300 so as to achieve the aim of improving a bonding yield. In the bonding scheme as shown in FIG. 1, an expansion schematic diagram of a corresponding bonding area is shown in FIG. 22, a small arrow represents the expansion direction of the flexible circuit boards, a big arrow represents the expansion direction of the printed circuit board, the four flexible circuit boards are in bonding on the printed circuit board at the same time, the heated printed circuit board wholly expands, all the flexible circuit boards expand by themselves, and poor bonding caused by an insufficient contact area of corresponding pads of the flexible circuit boards and the printed circuit board is quite easily generated.

Figure 22:
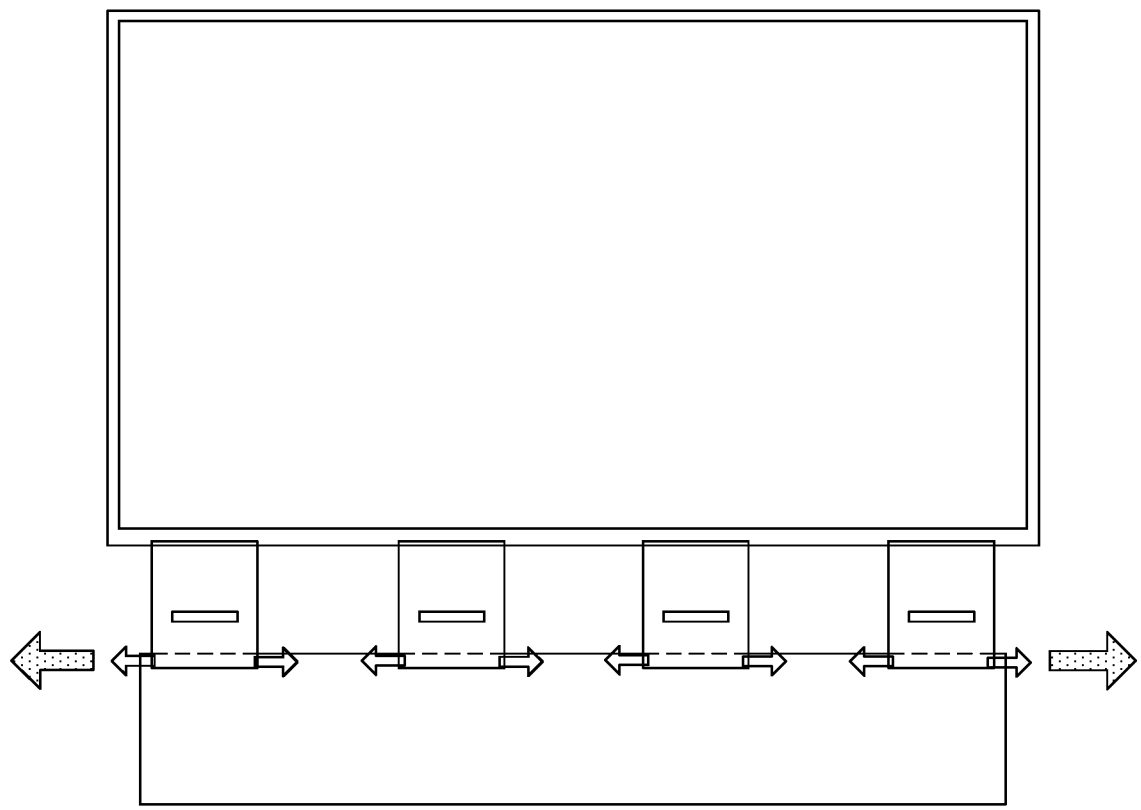
FIG. 22 is an expansion schematic diagram of a corresponding bonding area in the bonding scheme shown in FIG. 1.
Figure 23:
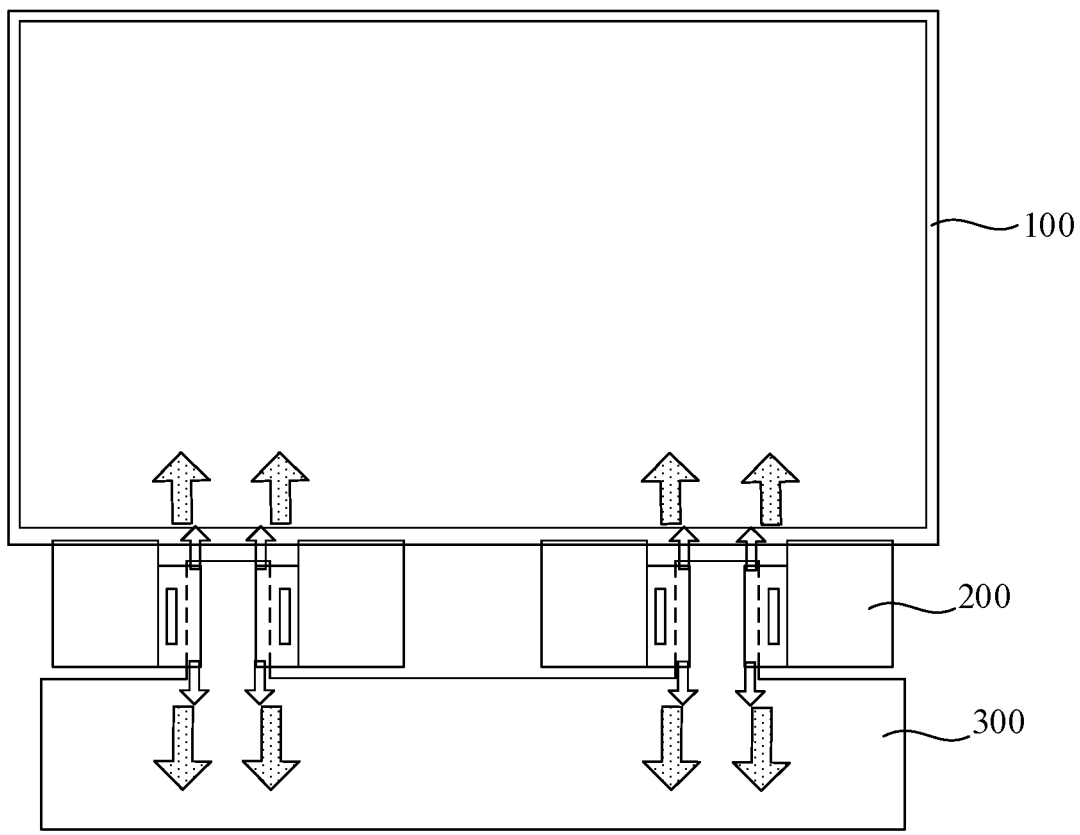
FIG. 23 is an expansion schematic diagram of a corresponding bonding area in the bonding scheme shown in FIG. 20.

When the bonding scheme as shown in FIG. 20 of the embodiment of the present disclosure is adopted, the expansion schematic diagram of the corresponding bonding area is shown in FIG. 23, the small arrow represents the expansion direction of the flexible circuit boards 200, the big arrow represents the expansion direction of the printed circuit board 300, the flexible circuit boards 200 and the printed circuit board 300 expand synchronously, and in a case that the bonding precision and the pitch the same as FIG. 22 are adopted, the pad contact area is relatively stable, and the bonding yield is higher.

Figure 24:
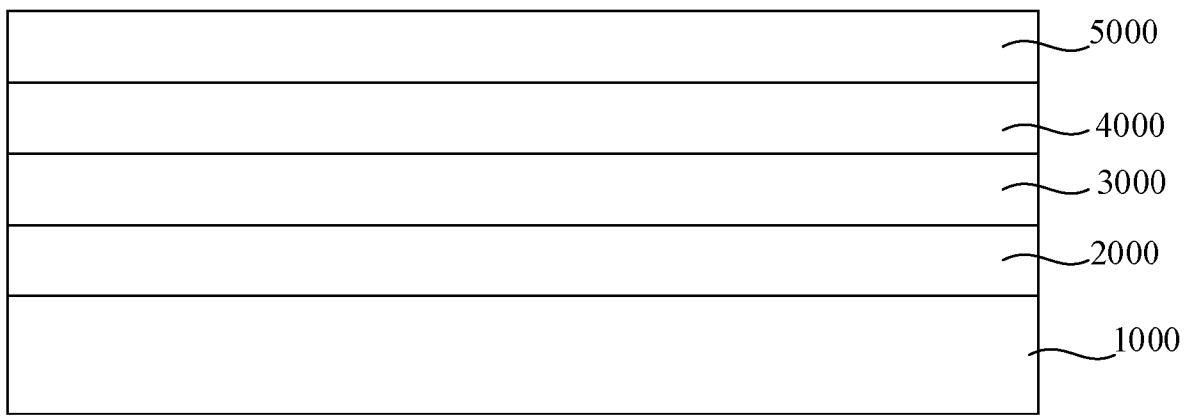
FIG. 24 is one of structural schematic diagrams of a vehicle display apparatus provided by an embodiment of the present disclosure.

Based on the same disclosed conception, as shown in FIG. 24, an embodiment of the present disclosure further provides a vehicle display apparatus, including: a display module 1000 as described above, and a thin film encapsulation layer 2000, a touch function layer 3000, a filter layer 4000 and a protection cover plate 5000 which are located on the display module 1000.

In the specific implementation, a principle of solving problems by the vehicle display apparatus is similar to an above flexible circuit board 200 and an above printed circuit board 300, and repetition will not be repeated. In one of application scenarios, the display module 1000 may be in non-rectangular arrangement, for example, a C shape or an S shape, correspondingly, the vehicle display apparatus is in a C shape or an S shape, the vehicle display apparatus may be applied to a vehicle, and the vehicle may be an automotive vehicle or may be a non-motor vehicle. For example, the vehicle display apparatus is applied to the automotive vehicle, the vehicle display apparatus may be arranged at a position of a navigator and serves as the navigator, the vehicle display apparatus also may be arranged at a position of a forward-viewing mirror, the vehicle display apparatus also may be arranged within a visibility range of a co-driver, and certainly, a specific position and a function of the vehicle display apparatus may be arranged according to the actual application needs, which is not limited here.

In the specific implementation, the thin film encapsulation layer 2000 is configured to encapsulate the display module 1000 to block water and oxygen erosion so as to prevent water and oxygen from entering the display module 1000 to cause failure of the display module 1000, wherein the thin film encapsulation layer 2000 may include a first inorganic layer, a second inorganic layer and an organic layer located between the first inorganic layer and the second inorganic layer, a material of the first inorganic layer may be at least one of silicon oxide, silicon nitride or silicon nitride, and a material of the second inorganic layer may be at least one of silicon oxide, silicon nitride or silicon nitride. Certainly, the thin film encapsulation layer 2000 may further include more film layers in which inorganic layers and organic layers are alternatively arranged, which is not limited here.

In the specific implementation, the vehicle display apparatus further includes the touch function layer 3000 (e.g., a flexible multi-layer on cell (FMLOC)) on the thin film encapsulation layer 2000, correspondingly, all films of the flexible multi-layer on cell 3000 may be directly manufactured on the thin film encapsulation layer 2000, correspondingly, the flexible multi-layer on cell 3000 is arranged in a film structure, therefore, a touch substrate does not need to be additionally arranged, and a touch function of the vehicle display apparatus is ensured while thinning design of the vehicle display apparatus is ensured.

In the specific implementation, the vehicle display apparatus further includes the filter layer 4000 located on the flexible multi-layer on cell 3000, the filter layer 4000 may be a polaroid and also may be a color filter, the thickness of the polaroid is generally large, when the filter layer 4000 adopts the color filter, that, a color filter on encapsulation (COE) technology is adopted, and thinning design of the vehicle display apparatus is ensured.

In the specific implementation, the vehicle display apparatus further includes the protection cover plate 5000 located on the filter layer 4000. Not only can the display module be protected from damage by the protection cover plate 5000, but also the use performance of the vehicle display apparatus can be improved by setting a coating with a specific function on the protection cover plate 5000. The coating includes one or a plurality of an AG (anti-glare) protection film, an AF (anti-fingerprint) film and a UV (ultraviolet-proof) protection film, which is not limited here.

In the specific implementation, other essential components of the vehicle display apparatus should be understood by those ordinarily skilled in the art, which is not repeated here, also should not be taken as a limit to the present disclosure.

Although preferred embodiments of the present disclosure are already described, once those skilled in the art know a basic creative concept, addition change and modifications may be made on the embodiments. Therefore, appended claims are intended to be illustrated to include the preferred embodiments and all changes and modifications falling within the scope of the present disclosure.

Obviously, those skilled in the art may perform various alterations and variations on the present disclosure without departing from the spirit and range of the present disclosure. Therefore, if these modifications and variations of the present disclosure fall within the claims of the present disclosure and the range of the equivalent technology thereof, the present disclosure is also intended to include these modifications and variations.

What is claimed is:

1. A display module, comprising:
   a display panel, at least one flexible circuit board and at least one printed circuit board; wherein
   the display panel comprises a plurality of connection pads located in a bonding area;
   the flexible circuit board comprises a first body, a plurality of output pads and a plurality of input pads, wherein the first body comprises a bendable portion and a flat portion which are connected, the bendable portion comprises a protruding portion protruding relative to the flat portion, the plurality of output pads are located on the protruding portion, and are in bonding connection with the plurality of connection pads, and the plurality of input pads are located on one side of the flat portion away from the bendable portion; and
   the printed circuit board comprises a second body and a plurality of bonding pads, wherein the second body comprises a strip-shaped main body portion and at least one branching portion connected with a long side of the strip-shaped main body portion, the plurality of bonding pads are located on at least one side edge of each branching portion adjacent to the strip-shaped main body portion, and the plurality of bonding pads are in bonding connection with the plurality of input pads.

2. The display module according to claim 1, wherein the output pads extend in a first direction and are sequentially arranged in a second direction intersecting with the first direction, the input pads extend in a third direction and are sequentially arranged in a fourth direction intersecting with the third direction, the first direction is roughly the same as the fourth direction, and the second direction is roughly the same as the third direction.

3. The display module according to claim 2, wherein the flat portion comprises a first side edge adjacent to the protruding portion, a second side edge opposite to the first side edge and a third side edge away from the bendable portion, the first side edge and the second side edge both extend in the second direction, the first side edge is longer than the second side edge, and the third side edge inclines by a preset angle relative to the first direction.

4. The display module according to claim 3, wherein the fourth direction is roughly the same as an extending direction of the third side edge.

5. The display module according to claim 2, wherein the flexible circuit board further comprises a driver chip located on the flat portion, and the driver chip is located on one sides of the plurality of input pads close to the bendable portion.

6. The display module according to claim 5, wherein the driver chip roughly extends in the first direction.

7. The display module according to claim 5, wherein an extending direction of the driver chip is roughly the same as an extending direction of the third side edge of the flat portion away from the bendable portion.

8. The display module according to claim 5, wherein the flexible circuit board further comprises a plurality of signal wires, each signal wire is electrically connected with the driver chip and a corresponding output pad respectively, and lengths of the signal wires are roughly the same.

9. The display module according to claim 8, wherein a signal wire electrically connected with an output pad in the plurality of output pads close to the driver chip is in a curve design, and a signal wire electrically connected with an output pad in the plurality of output pads away from the driver chip is in a straight-line design.

10. The display module according to claim 9, wherein a shape of an orthographic projection of the signal wire electrically connected with the output pad in the plurality of output pads close to the driver chip on the flexible circuit board comprises at least one of a single triangle, a triangular sawtooth, a single rectangle, a rectangular sawtooth or an arc.

11. The display module according to claim 2, wherein the plurality of bonding pads extend in the third direction and are sequentially arranged in the fourth direction intersected with the third direction.

12. The display module according to claim 11, wherein only one side edge of two branching portions located at edges in the at least one branching portion adjacent to a short side of the strip-shaped main body portion is provided with the plurality of bonding pads, and two side edges of other branching portions adjacent to the strip-shaped main body portion are both provided with the plurality of bonding pads.

13. The display module according to claim 11, wherein two side edges of the branching portions adjacent to the strip-shaped main body portion are both provided with the plurality of bonding pads.

14. The display module according to claim 11, wherein a short side of the strip-shaped main body portion protrudes out of the branching portion on an outmost side.

15. The display module according to claim 11, wherein a short side of the strip-shaped main body portion is flush with a corresponding side edge of the branching portion on the outmost side.

16. A vehicle display apparatus, comprising:
a display module, and a thin film encapsulation layer, a touch function layer, a filter layer and a protection cover plate which are located on the display module; wherein the display module comprises:
a display panel, at least one flexible circuit board and at least one printed circuit board; wherein
the display panel comprises a plurality of connection pads located in a bonding area;
the flexible circuit board comprises a first body, a plurality of output pads and a plurality of input pads, wherein the first body comprises a bendable portion and a flat portion which are connected, the bendable portion comprises a protruding portion protruding relative to the flat portion, the plurality of output pads are located on the protruding portion, and are in bonding connection with the plurality of connection pads, and the plurality of input pads are located on one side of the flat portion away from the bendable portion; and
the printed circuit board comprises a second body and a plurality of bonding pads, wherein the second body comprises a strip-shaped main body portion and at least one branching portion connected with a long side of the strip-shaped main body portion, the plurality of bonding pads are located on at least one side edge of each branching portion adjacent to the strip- shaped main body portion, and the plurality of bonding pads are in bonding connection with the plurality of input pads.

17. The vehicle display apparatus according to claim 16, wherein the output pads extend in a first direction and are sequentially arranged in a second direction intersecting with the first direction, the input pads extend in a third direction and are sequentially arranged in a fourth direction intersecting with the third direction, the first direction is roughly the same as the fourth direction, and the second direction is roughly the same as the third direction.

18. The vehicle display apparatus according to claim 17, wherein the flat portion comprises a first side edge adjacent to the protruding portion, a second side edge opposite to the first side edge and a third side edge away from the bendable portion, the first side edge and the second side edge both extend in the second direction, the first side edge is longer than the second side edge, and the third side edge inclines by a preset angle relative to the first direction.

19. The vehicle display apparatus according to claim 18, wherein the fourth direction is roughly the same as an extending direction of the third side edge.

20. The vehicle display apparatus according to claim 17, wherein the flexible circuit board further comprises a driver chip located on the flat portion, and the driver chip is located on one sides of the plurality of input pads close to the bendable portion.

* * * * *